United States Patent
Singh

(10) Patent No.: US 10,896,723 B2
(45) Date of Patent: Jan. 19, 2021

(54) SIGNAL COMMUNICATION CIRCUIT IMPLEMENTING RECEIVER AND TRANSMITTER CIRCUITS

(71) Applicant: Ambient Scientific, Inc., San Jose, CA (US)

(72) Inventor: Gajendra Prasad Singh, San Jose, CA (US)

(73) Assignee: Ambient Scientific Inc., San Jose, CA (US)

( * ) Notice: Subject to any disclaimer, the term of this patent is extended or adjusted under 35 U.S.C. 154(b) by 0 days.

(21) Appl. No.: 16/399,921

(22) Filed: Apr. 30, 2019

(65) Prior Publication Data

US 2020/0350003 A1  Nov. 5, 2020

(51) Int. Cl.
| | | |
|---|---|---|
| G11C 11/418 | (2006.01) | |
| G11C 5/06 | (2006.01) | |
| G11C 11/412 | (2006.01) | |
| G11C 11/419 | (2006.01) | |

(52) U.S. Cl.
CPC ............ *G11C 11/418* (2013.01); *G11C 5/063* (2013.01); *G11C 11/412* (2013.01); *G11C 11/419* (2013.01)

(58) Field of Classification Search
CPC ... G11C 11/418; G11C 11/419; G11C 11/412; G11C 5/063
See application file for complete search history.

(56) References Cited

U.S. PATENT DOCUMENTS

| | | | |
|---|---|---|---|
| 2007/0058454 A1* | 3/2007 | Park | G11C 7/1078 365/189.06 |
| 2007/0208819 A1* | 9/2007 | Talbot | H04L 1/0026 709/208 |
| 2013/0002301 A1* | 1/2013 | Gondi | H03K 19/018557 326/83 |
| 2014/0306734 A1* | 10/2014 | Lee | H03K 19/017509 326/82 |
| 2017/0278553 A1* | 9/2017 | Kojima | G11C 7/12 |

* cited by examiner

*Primary Examiner* — Jerome Leboeuf
(74) *Attorney, Agent, or Firm* — Thomas C. Chan; Silicon Valley Patent Group LLP

(57) ABSTRACT

A signal communication circuit and methods for using the same are disclosed. In one embodiment, a circuit for signal communication includes a signal line configured to transmit signals, a transmitter circuit configured to drive a transmitted signal onto the signal line, a receiver circuit configured to detect the transmitted signal based on a deviation of a received signal from a reference signal on the signal line, and the receiver circuit is further configured to use the received signal to communicate the transmitted signal.

24 Claims, 25 Drawing Sheets

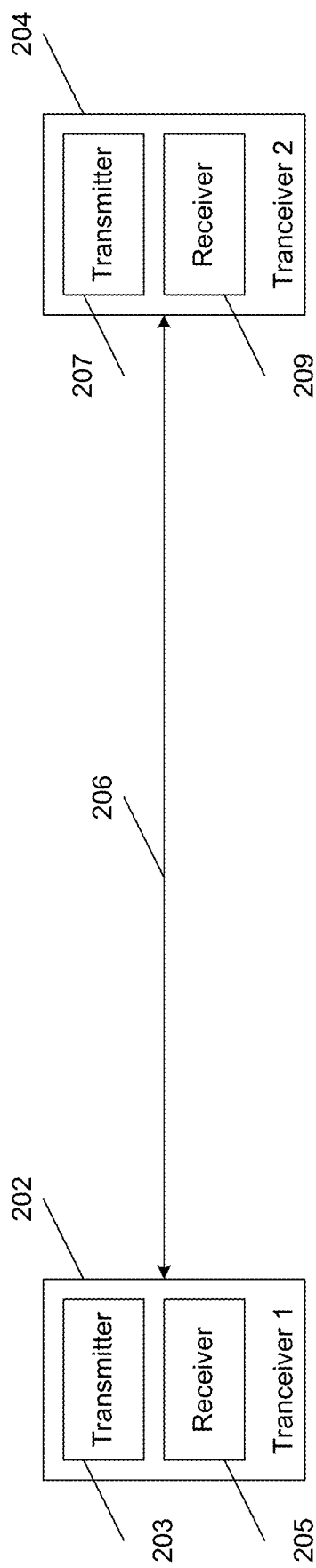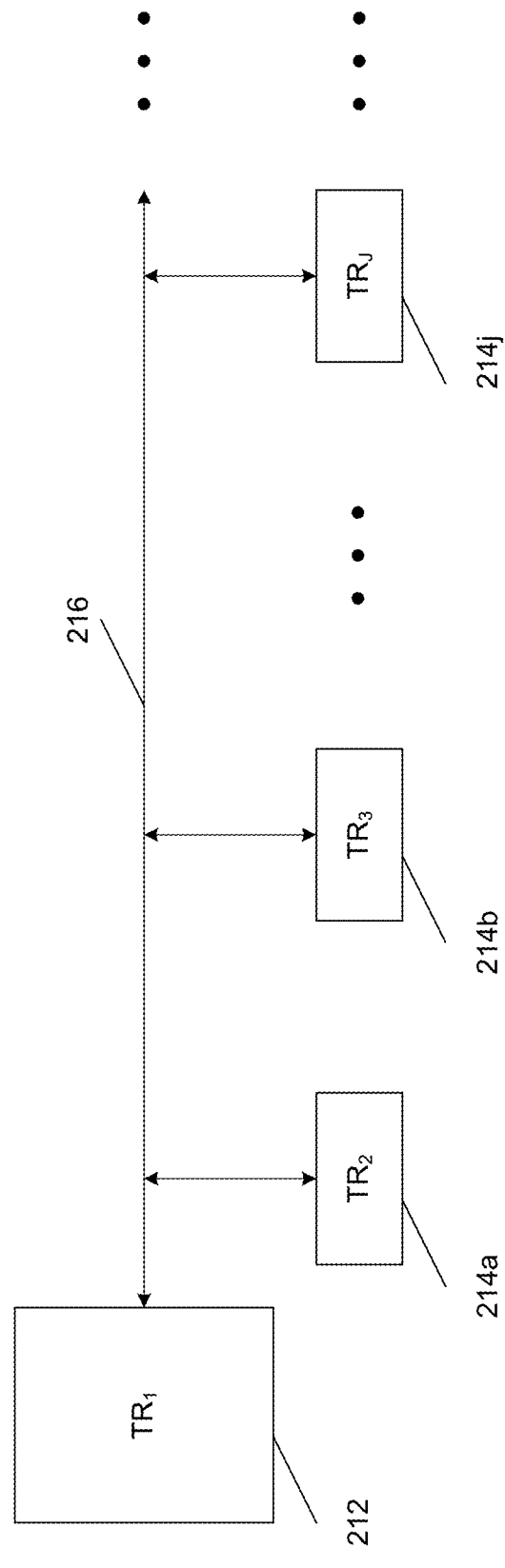
FIG. 2A
FIG. 2B

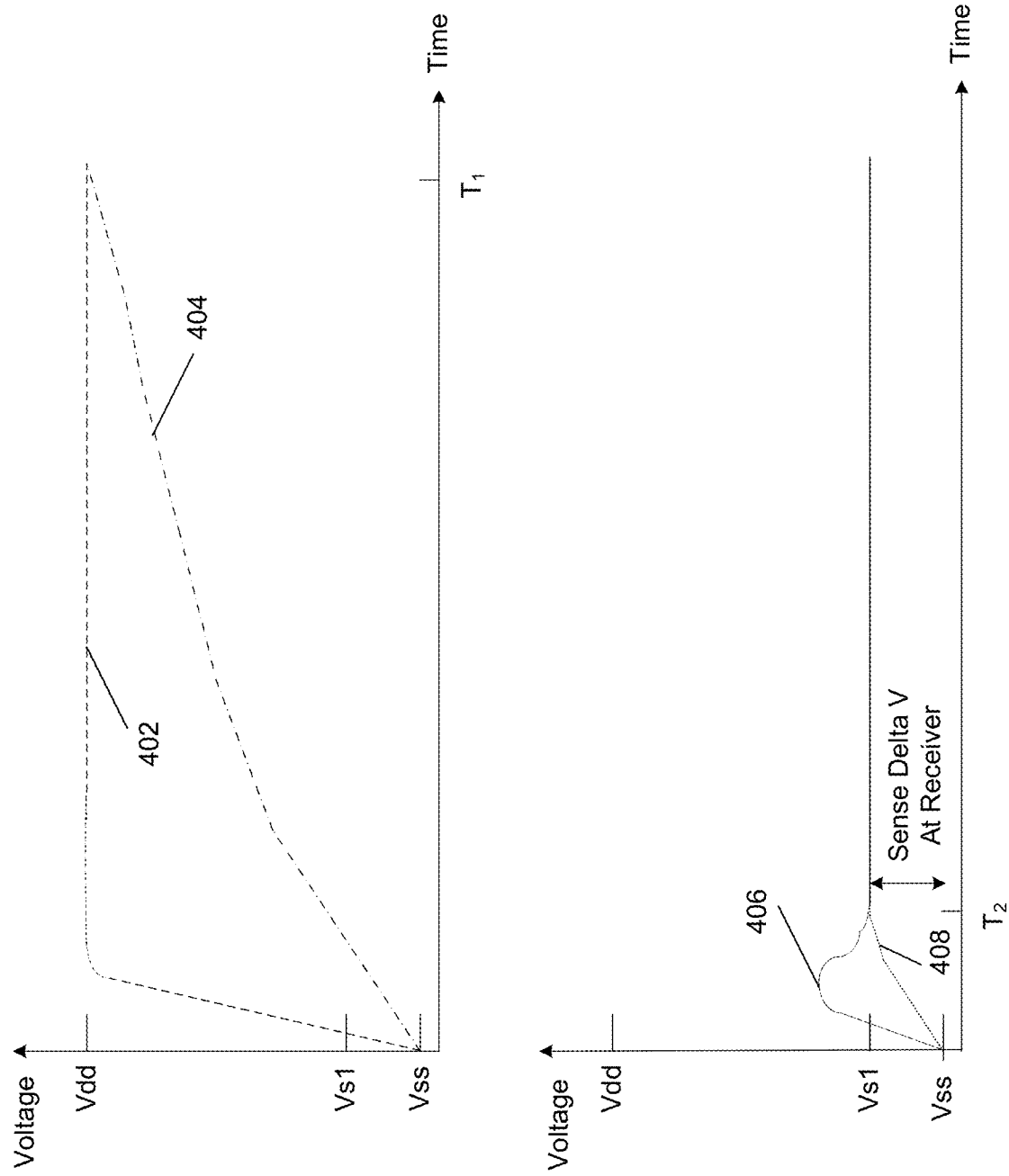

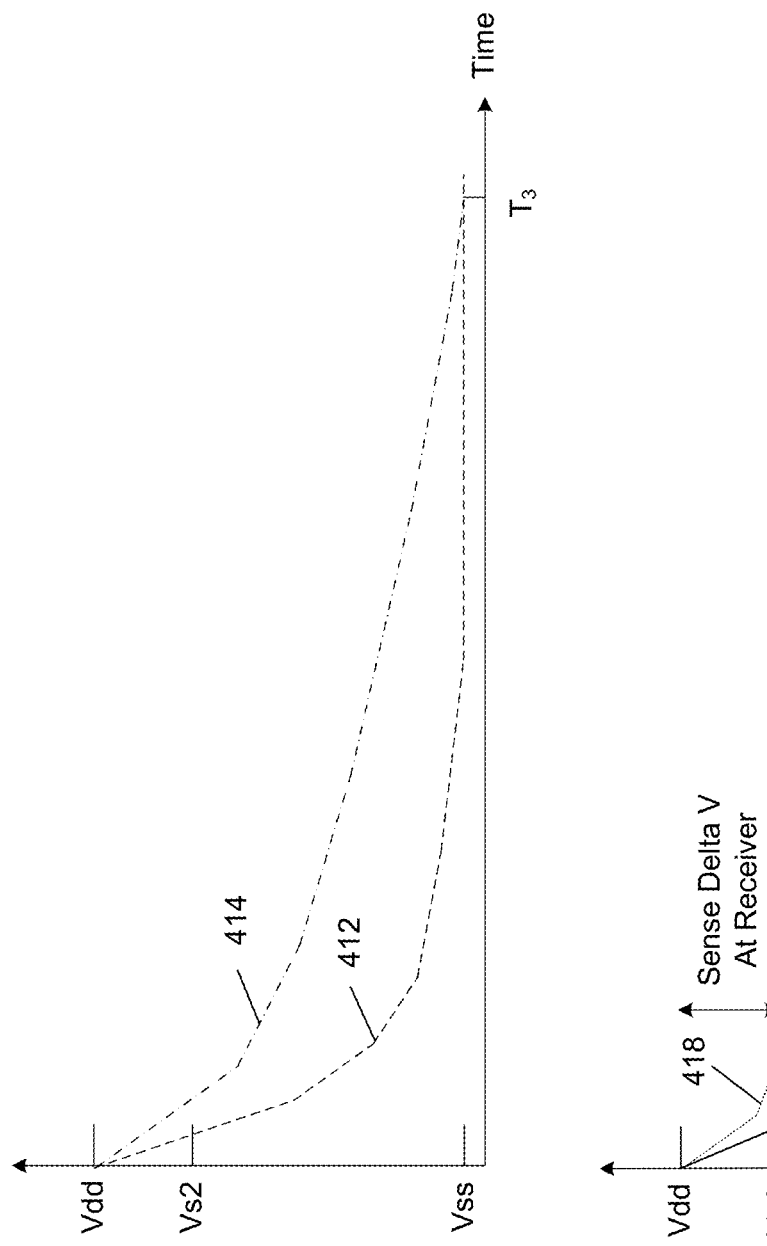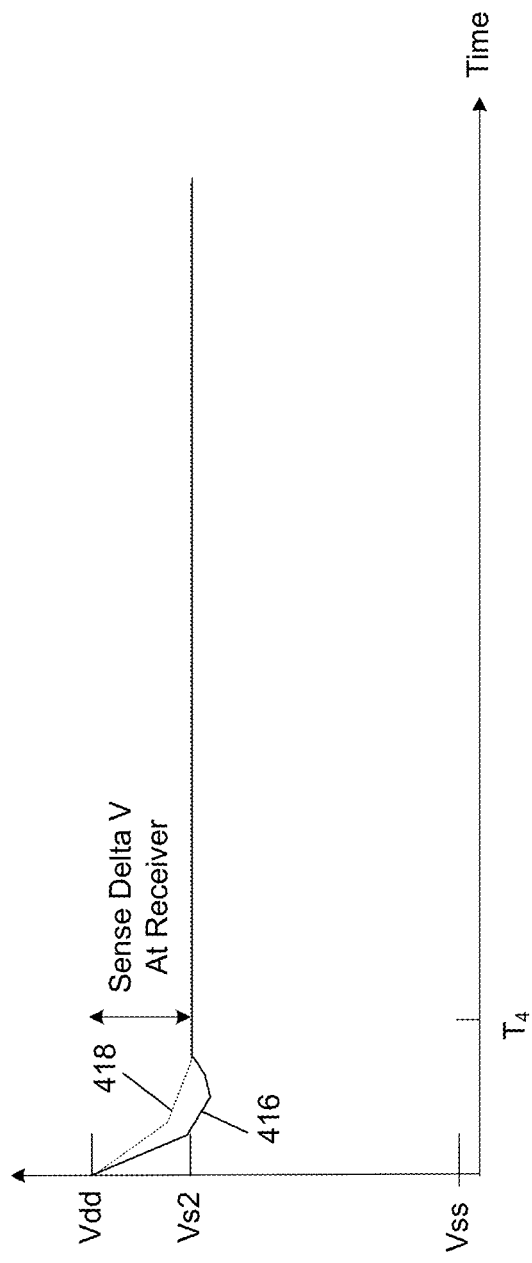

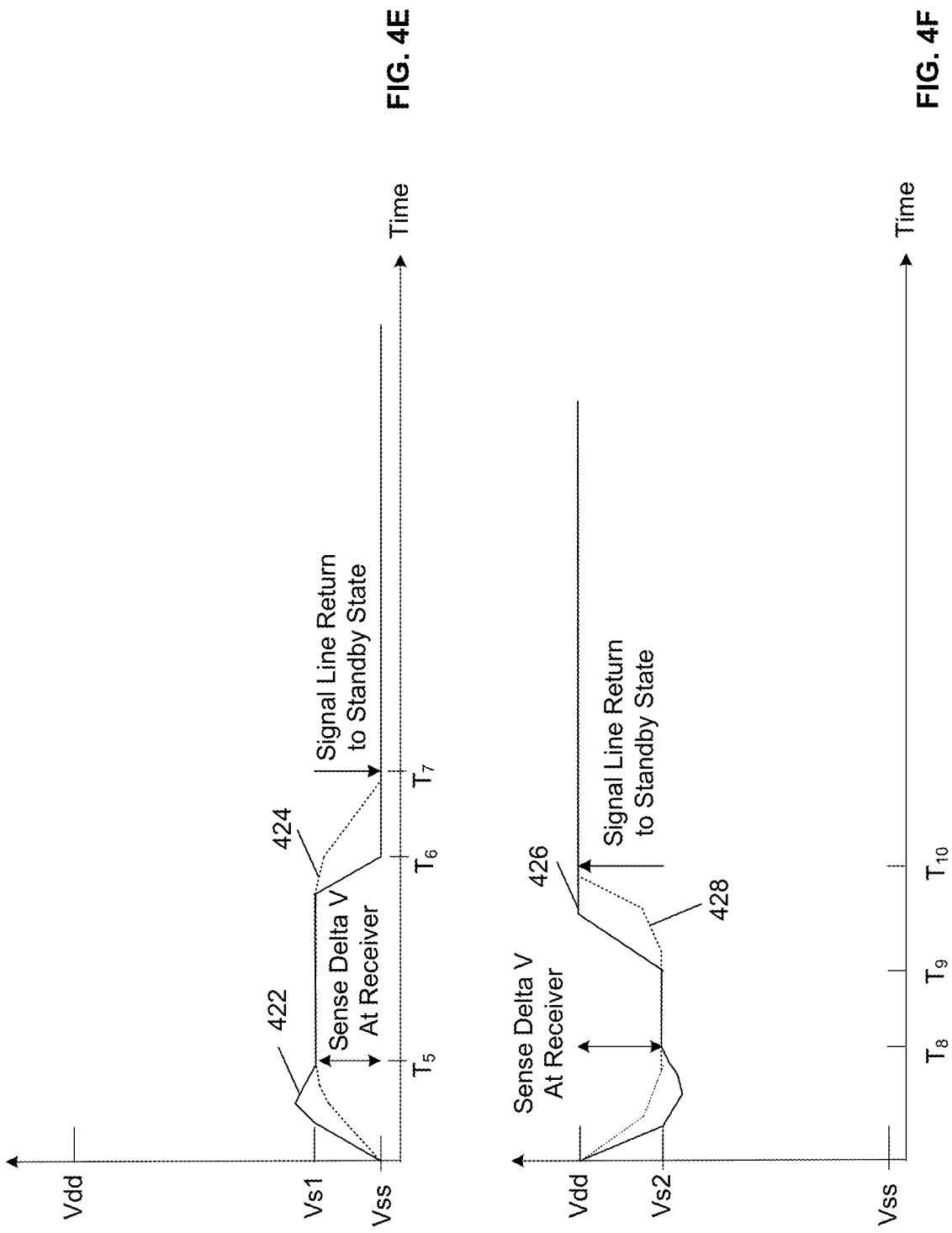

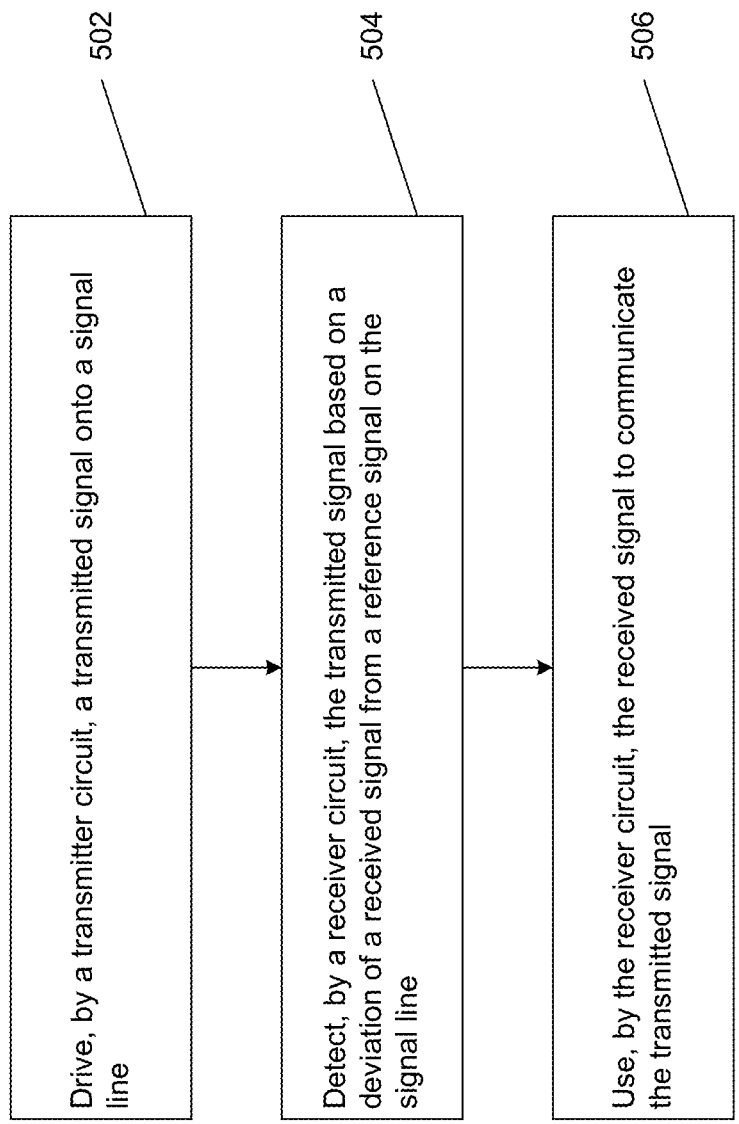

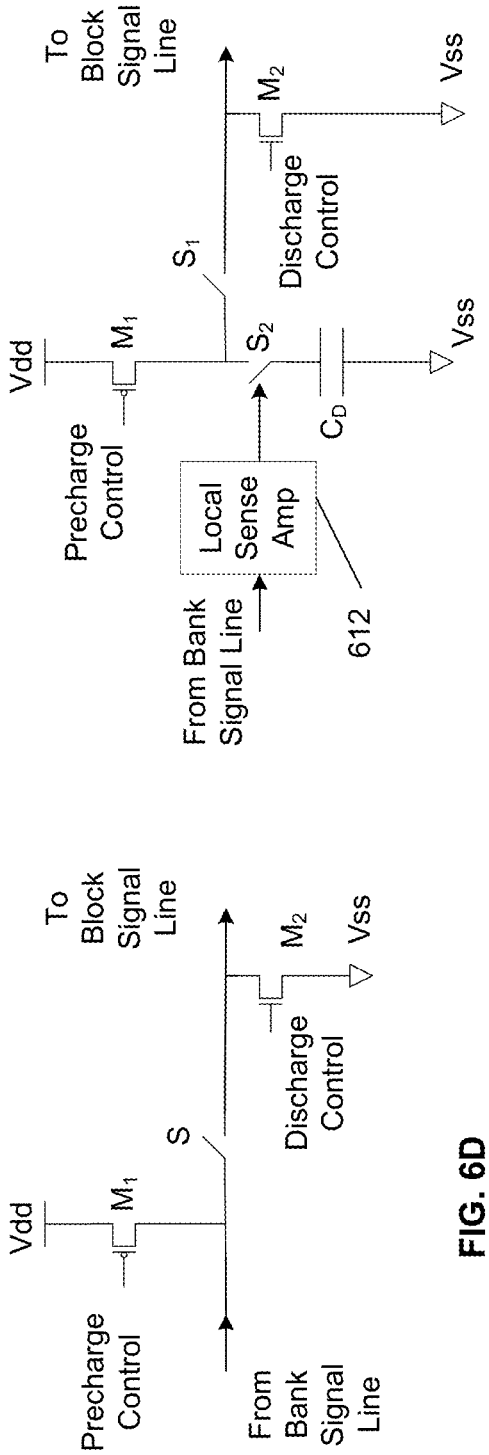
FIG. 6E
FIG. 6D
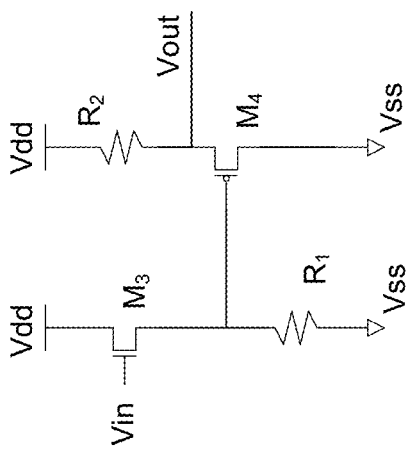
FIG. 6F

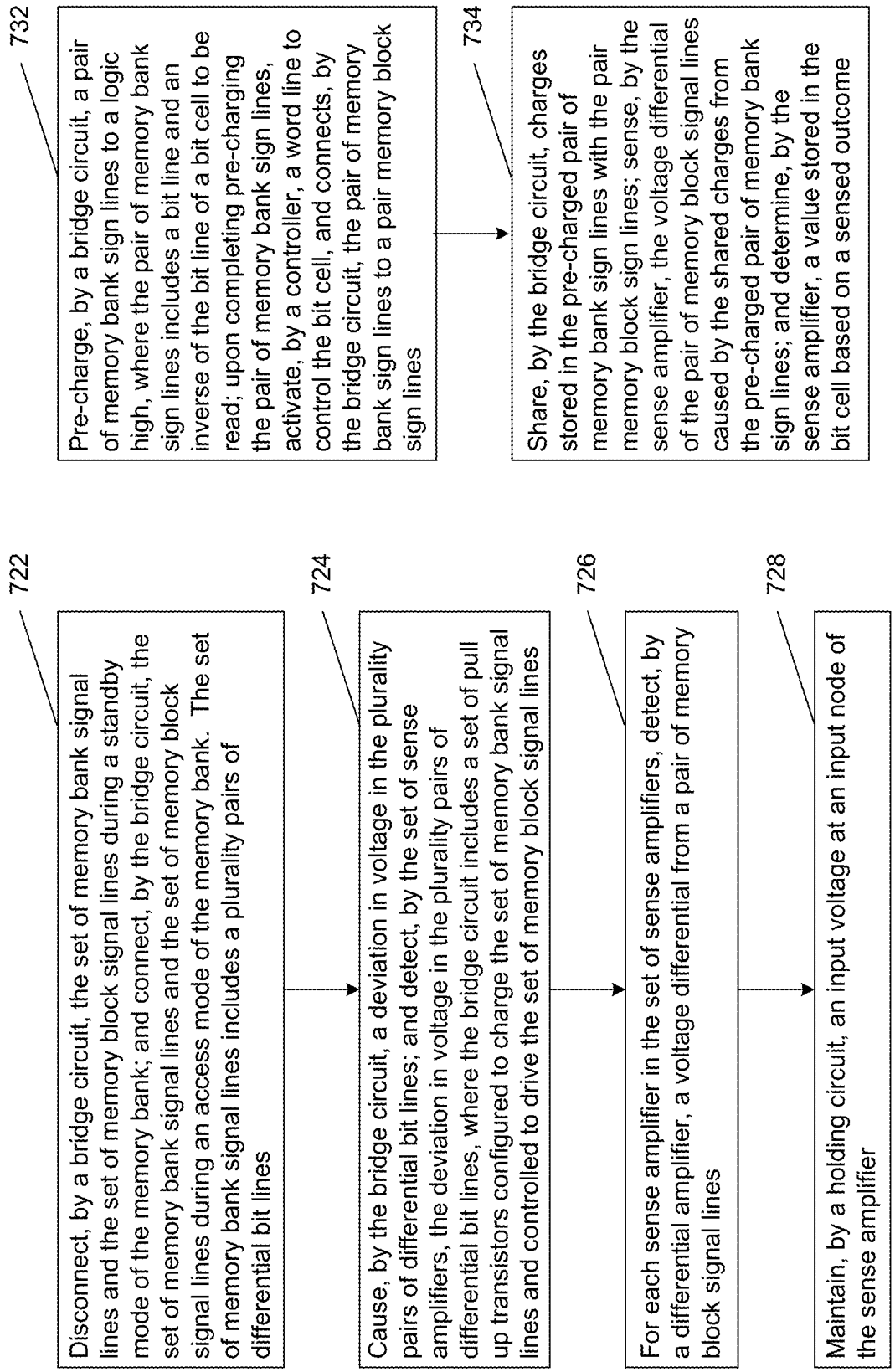

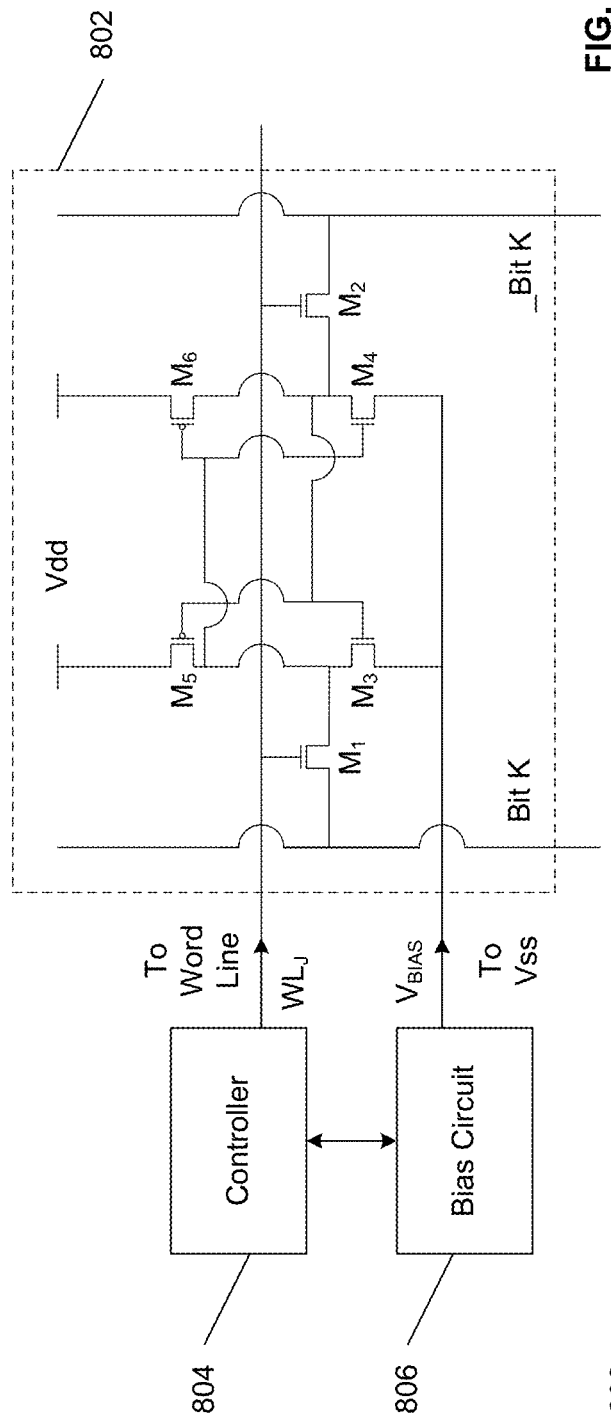
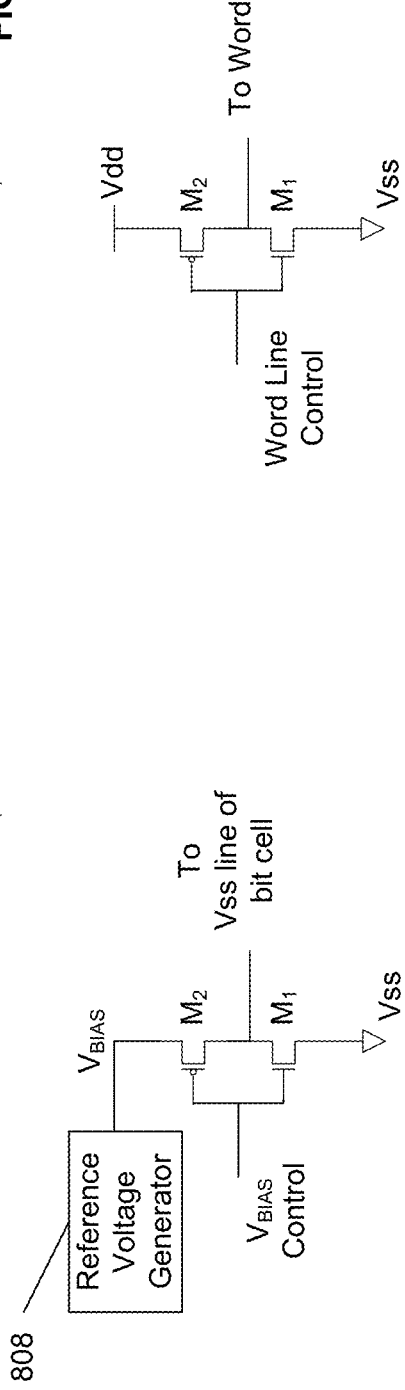
FIG. 8A
FIG. 8B
FIG. 8C

SIGNAL COMMUNICATION CIRCUIT IMPLEMENTING RECEIVER AND TRANSMITTER CIRCUITS

FIELD

The present invention relates to the field of integrated circuits. In particular, the present invention relates to a signal communication circuit and methods for using the same.

BACKGROUND

FIG. 1A illustrates a modeling of a signal line between a transmitter and a receiver. As shown in FIG. 1A, a transmitter 102 may be configured to transmit a signal through a signal line to a receiver 104. The transmitter 102 drives a transmitted signal at node 103 and the receiver 104 receives a received signal at node 105. The signal line may be modelled as a series of resistor-capacitor networks, labelled as 106a through 106j. The propagation delay through the signal line depends on electrical characteristics of the signal line, which is a function of the series of resistor-capacitor networks. As the signal line becomes longer, the propagation delay of the transmitter signal becomes longer, which adversely affects the performance of a system that uses the signal line. One way to overcome the above issue is to employ a stronger driver at the transmitter, thus driving more current onto the signal line. However, this solution consumes more power.

FIG. 1B illustrates a conventional method of signal communication among a transmitter and multiple receivers in a system. In the conventional method of FIG. 1B, another way to overcome the problem of FIG. 1A is shown. In this example, a transmitter 112 may be configured to transmit a signal through a signal line to a plurality of receivers, namely 114a through 114j. Similar to FIG. 1A, the signal line may be modelled as a series of resistor-capacitor networks, labelled as 116a through 116m. To reduce the propagation delay between the transmitter 112 and a receiver such as receiver 2 (labelled as 114b), a plurality of buffers, such as 118a through 118j, may be used to reduce propagation delay and ensure sufficient signal strength received at a receiver. There are a number of drawbacks with this conventional method. First, the communication between transmitter 112 and a receiver such as receiver J 114j becomes one directional. In other words, another set of signal line would be used to transmit a signal from receiver J 114j to transmitter 112. As the number of receiver increases in a system with a 32 bit or wider system bus, the number of signal paths and the components and areas used to support such signal paths increase exponentially, which can significantly increase the cost and complexity of the system.

FIG. 1C illustrates a conventional design of a subsection of a SRAM. In the conventional design of FIG. 1C, a subsection of a SRAM may include memory bank 0 (122a) and memory bank 1 (122b). Memory bank 0 may be accessed through column multiplexor 0 (124a) and similarly memory bank 1 may be accessed through column multiplexor 1 (124b). A set of sense amplifiers 126 are shared by the memory bank 0 and memory bank 1 through the column multiplexor 0 and column multiplexor 1, respectively. The set of sense amplifiers 126 drive a set of global bit lines corresponding to local bit lines of memory bank 0 and memory bank 1. This subsection of SRAM can be part of a SRAM memory block, where multiple SRAM memory blocks may form the memory core of the SRAM.

FIG. 1D illustrates a conventional design of a SRAM memory bank of FIG. 1C. As shown in FIG. 1D, a memory bank may include multiple rows and columns of bit cells (BCs), represented by BC 128. In this example, a 32-bit memory bank width is shown. In other implementations, different memory bank widths may be designed, such as memory bank width of 8, 16, 64, 128, 256 bits may be implemented. In this example, each row of the memory bank is controlled by a word line, for example $WL_0$ controls the top row of the memory bank. Each column of the memory bank is controlled by a pair of differential signal lines, for example Bit0 and its inverse Bit0 control the left column, and Bit31 and its inverse Bit31 control the left column.

To increase the storage and to reduce the ratio of overhead area (for sense amplifiers and column multiplexors) to bit cells area, a typical conventional design would pack many rows of bit cells into a memory bank. To reduce power consumption, each bit cell in the typical conventional design would have a weak drive strength. These design criteria impose adverse impact on the performance and power consumption of the SRAM.

FIG. 1E illustrates a conventional design of a bit cell of a SRAM. In the conventional design of FIG. 1E, a bit cell may include transistors $M_1$, $M_2$, $M_3$, $M_4$, $M_4$, $M_5$, and $M_6$; and the transistors $M_1$, $M_2$, $M_3$, $M_4$, $M_4$, $M_5$, and $M_6$ are connected in the manner shown in FIG. 1E. The transistors are controlled by a word line (for example $WL_j$) and by a pair of differential bit lines (for example Bit K and _BitK). The drain terminals of transistors $M_5$, and $M_6$ are typically pulled up to Vdd, and the source terminals of transistors $M_3$ and $M_4$ are coupled to Vss.

There are multiple paths that can produce leakage current in the bit cell when the word line is asserted/activated, even though a transistor may be considered as logically off. For example, one leakage path is through $M_1$ and $M_3$; another leakage path is through $M_5$ and $M_3$; yet another leakage path is through $M_6$ and $M_4$; and yet another leakage path is through $M_2$ and $M_4$. Note that the leakage through the NMOS transistors are larger compare to the leakage through the PMOS transistors, because the size of the NMOS transistors is larger than the size of the PMOS transistors.

When the bit cell is in standby mode, one of the PMOS transistor $M_5$ or $M_6$ may still be on, which creates at least one leakage path. In other words, even during the standby mode, most of the bit cells may have at least one leakage path. To prevent leakage in the standby mode, FIG. 1F illustrates a conventional method of static power reduction in a SRAM. As shown in the conventional method of FIG. 1F, during the access mode, the drain terminals of transistors $M_5$, and $M_6$ are typically pulled up to Vdd, and the source terminals of transistors $M_3$ and $M_4$ are coupled to Vss. During the standby mode, the drain terminals of transistors $M_5$, and $M_6$ are typically pulled up to a retention voltage $V_{RETENTION}$, which is lower than Vdd, and the source terminals of transistors $M_3$ and $M_4$ remain at Vss. In this manner, power leakage can be reduced. However, one drawback with the above conventional method is that there is a long delay to transition from the standby mode back to the access mode, because the adjustment of power supply is done to the entire SRAM or may be done to the entire circuit that includes the SRAM. The long delay makes frequent switching between the access mode and standby mode impractical when a device is being used.

Therefore, it is desirable to have signal communication circuit and methods for using the same in order to improve the performance and to reduce power consumption of the above conventional methods.

SUMMARY

A signal communication circuit and methods for using the same are disclosed. In one embodiment, a circuit for signal communication includes a signal line configured to transmit signals, a transmitter circuit configured to drive a transmitted signal onto the signal line, a receiver circuit configured to detect the transmitted signal based on a deviation of a received signal from a reference signal on the signal line, and the receiver circuit is further configured to use the received signal to communicate the transmitted signal.

In another embodiment, a method of signal communication includes driving a transmitted signal onto a signal line; detecting the transmitted signal based on a deviation of a received signal from a reference signal on the signal line; and using the received signal to communicate the transmitted signal.

BRIEF DESCRIPTION OF THE DRAWINGS

The aforementioned features and advantages of the disclosure, as well as additional features and advantages thereof, will be more clearly understandable after reading detailed descriptions of embodiments of the disclosure in conjunction with the non-limiting and non-exhaustive aspects of following drawings. Like numbers are used throughout the specification.

FIG. 2A illustrates an exemplary representation of signal communication between two transceivers of a system according to aspects of the present disclosure.

FIG. 2B illustrates an exemplary representation of signal communication among multiple transceivers in a system according to aspects of the present disclosure.

FIG. 4A illustrates exemplary node voltages at an output node of a transmitter and an input node of a receiver based on a conventional implementation of low to high signal transition.

FIG. 4B illustrates exemplary node voltages at an output node of a transmitter and an input node of a receiver based on the implementation of FIG. 2A for a low to high signal transition according to aspects of the present disclosure.

FIG. 4C illustrates another exemplary node voltages at an output node of a transmitter and an input node of a receiver based on a conventional implementation of high to low signal transition.

FIG. 4D illustrates another exemplary node voltages at an output node of a transmitter and an input node of a receiver based on the implementation of FIG. 2A for a high to low signal transition according to aspects of the present disclosure.

FIG. 4E illustrates yet another exemplary node voltages at an output node of a transmitter and an input node of a receiver based on the implementation of FIG. 3C for a low to high signal transition.

FIG. 4F illustrates yet another exemplary node voltages at an output node of a transmitter and an input node of a receiver based on the implementation of FIG. 3C for a high to low signal transition.

FIG. 5A illustrates an exemplary method of signal communication between a transmitter and a receiver according to aspects of the present disclosure.

FIG. 6D illustrates an exemplary bridge circuit according to aspects of the present disclosure.

FIG. 6E illustrates another exemplary bridge circuit according to aspects of the present disclosure.

FIG. 6F illustrates an exemplary holding circuit according to aspects of the present disclosure.

FIG. 7B illustrates an exemplary implementation of bridging between a set of memory bank signal lines and a set of memory block signal lines according to aspects of the present disclosure.

FIG. 7C illustrates an exemplary method of performing a read operation of a SRAM according to aspects of the present disclosure.

FIG. 8A illustrates an exemplary implementation of controlling a bit cell in a SRAM according to aspects of the present disclosure.

FIG. 8B illustrates an exemplary implementation of generating a bias voltage to circuit ground of a bit cell in a SRAM according to aspects of the present disclosure.

FIG. 8C illustrates an exemplary implementation of controlling a word line of a bit cell in a SRAM according to aspects of the present disclosure.

DESCRIPTION OF EMBODIMENTS

Figure 1A:
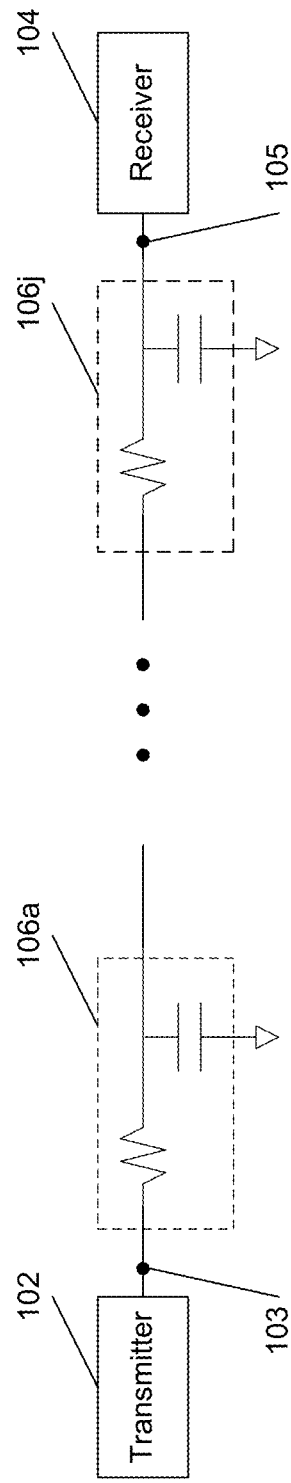
FIG. 1A illustrates a modeling of a signal line between a transmitter and a receiver.
Figure 1B:
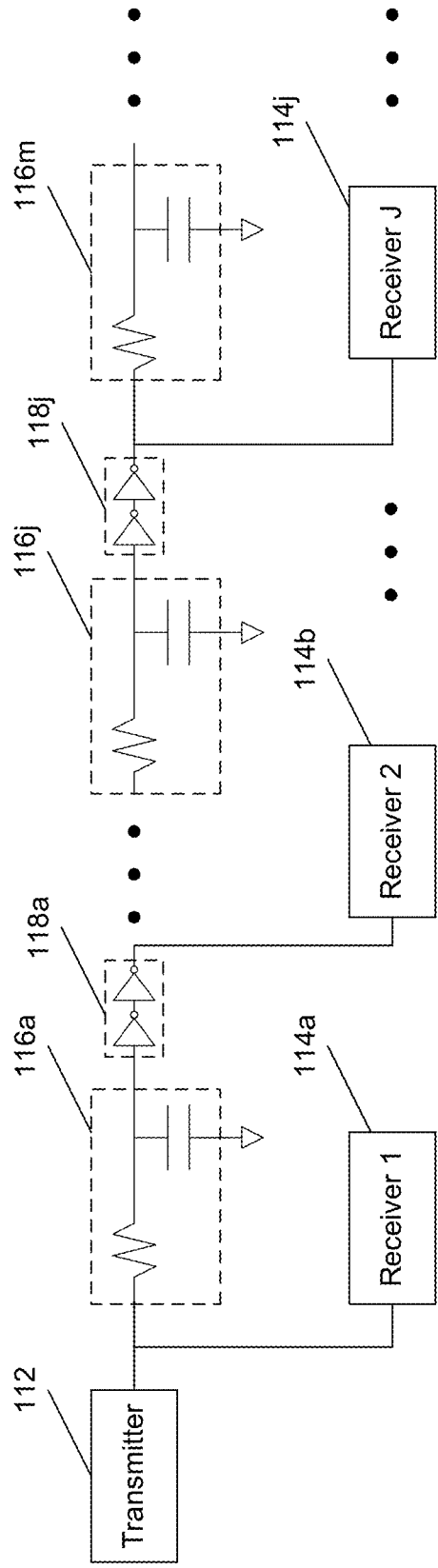
FIG. 1B illustrates a conventional method of signal communication among a transmitter and multiple receivers in a system.

The following descriptions are presented to enable a person skilled in the art to make and use the disclosure. Descriptions of specific embodiments and applications are provided only as examples. Various modifications and combinations of the examples described herein will be readily apparent to those skilled in the art, and the general principles defined herein may be applied to other examples and applications without departing from the scope of the disclosure. Thus, the present disclosure is not intended to be limited to the examples described and shown, but is to be accorded the scope consistent with the principles and features disclosed herein. The word "exemplary" or "example" is used herein to mean "serving as an example, instance, or illustration." Any aspect or embodiment described herein as "exemplary" or as an "example" in not necessarily to be construed as preferred or advantageous over other aspects or embodiments.

FIG. 2A illustrates an exemplary representation of signal communication between two transceivers of a system according to aspects of the present disclosure. As shown in FIG. 2A, a first transceiver 202 may be configured to transmit a signal through a signal line 206 to a second transceiver 204. The first transceiver 202 may include a first transmitter 203 and a first receiver 205. The second transceiver 204 may include a second transmitter 207 and a second receiver 209. The signal line may be modelled as a series of resistor-capacitor networks, and the propagation delay through the signal line depends on electrical characteristics of the signal line, which is a function of the series of resistor-capacitor networks. In this exemplary implementation, the communication between transceiver 1 (202) and transceiver 2 (204) is bi-directional. For example, transmitter 203 of transceiver 1 (202) may be configured to send a transmitted signal through the signal line 206 and be received as a received signal at receiver 209 of transceiver 2 (204). Similarly, transmitter 207 of transceiver 2 (204) may be configured to send a transmitted signal through the signal line 206 and be received as a received signal at receiver 205 of transceiver 1 (202).

FIG. 2B illustrates an exemplary representation of signal communication among multiple transceivers in a system according to aspects of the present disclosure. In the example of FIG. 2B, a first transceiver $TR_1$ 212 may be configured to communication with a plurality of transceivers, labelled as $TR_2$ 214a, $TR_3$ 214b, through $TR_j$ 214j, etc. Similar to FIG. 2A, the communication between $TR_1$ 212 and the plurality of transceivers ($TR_2$ 214a, $TR_3$ 214b, through $TR_j$ 214j) are bi-directional.

Figure 3A:
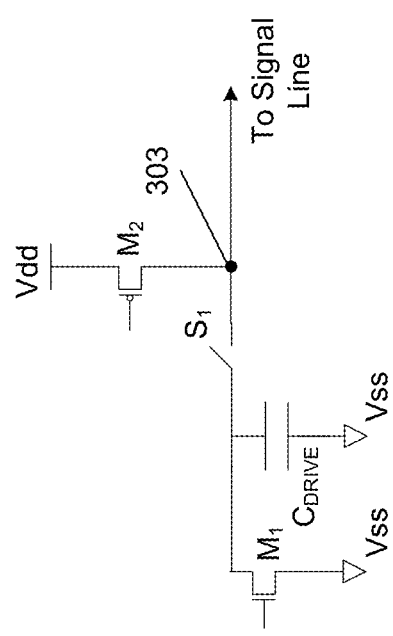
FIG. 3A illustrates an exemplary implementation of a transmitter of FIG. 2A according to aspects of the present disclosure.

FIG. 3A illustrates an exemplary implementation of a transmitter of FIG. 2A according to aspects of the present disclosure. In the exemplary implementation of FIG. 3A, a transmitter may include a driver capacitor $C_{DRIVE}$, and a first transistors $M_1$ configured to discharge the driver capacitor $C_{DRIVE}$. The transmitter may further include a second transistor $M_2$ configured to charge a node 303 at the transmitter end of a signal line such as signal line 206. The transmitter may further include a switch $S_1$ configured to connect or separate the driver capacitor $C_{DRIVE}$ and the signal line during different phases of an operation. The driver capacitor $C_{DRIVE}$, the first transistor $M_1$, the second transistor $M_2$, and the switch $S_1$ are connected in the manner shown in FIG. 3A.

During operation, to drive a high to low signal transition onto the signal line, in phase one with switch S1 open, the driver capacitor CDRIVE is discharged to logic low through the control of the M1 transistor while node 303 is charged to logic high through the control of M2 transistor. Then in phase two, switch S1 is closed, causing charge sharing among the driver capacitor CDRIVE and the capacitors of the signal line, resulting in a controlled high to low voltage transition at the receiver end of the receiving transceiver. The controlled high to low voltage transition may have a magnitude that is proportional to a ratio of capacitance between the driver capacitor CDRIVE and the capacitors of the signal line. In addition, the controlled high to low voltage transition can be captured and sensed by a sense amplifier to determine the high to low signal transition by the receiver at the receiving transceiver. The transistors M1, M2, and the switch S1 are controlled in the manner as described above for a high to low signal transition.

Figure 3B:
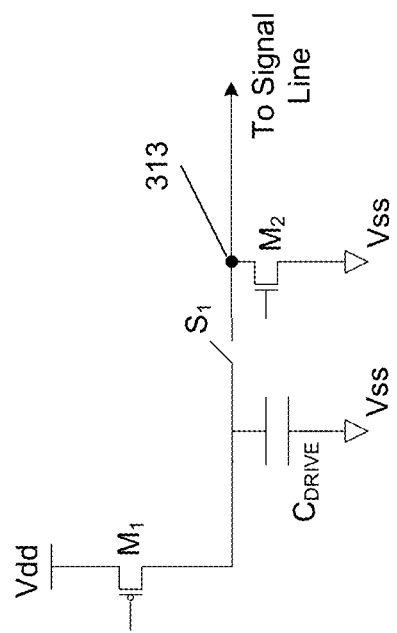
FIG. 3C illustrates another exemplary implementation of a transmitter of FIG. 2A according to aspects of the present disclosure.
FIG. 3E illustrates an exemplary implementation of a receiver of FIG. 2A according to aspects of the present disclosure.
FIG. 3F illustrates another exemplary implementation of a receiver of FIG. 2A according to aspects of the present disclosure.
FIG. 3G illustrates yet another exemplary implementation of a receiver of FIG. 2A according to aspects of the present disclosure.

FIG. 3B illustrates an exemplary implementation of a transmitter of FIG. 2A according to aspects of the present disclosure. In the exemplary implementation of FIG. 3B, a transmitter may include a driver capacitor $C_{DRIVE}$, and a first transistors $M_1$ configured to charge the driver capacitor $C_{DRIVE}$. The transmitter may further include a second transistor $M_2$ configured to discharge a node 313 at the transmitter end of a signal line such as signal line 206. The transmitter may further include a switch $S_1$ configured to connect or separate the driver capacitor $C_{DRIVE}$ and the signal line during different phases of an operation. The driver capacitor $C_{DRIVE}$, the first transistor $M_1$, the second transistor $M_2$, and the switch $S_1$ are connected in the manner shown in FIG. 3B.

During operation, to drive a low to high signal transition onto the signal line, in phase one with switch $S_1$ open, the driver capacitor $C_{DRIVE}$ is charged to logic high through the control of the $M_1$ transistor while node 313 is discharged to logic low through the control of $M_2$ transistor. Then in phase two, switch $S_1$ is closed, causing charge sharing among the driver capacitor $C_{DRIVE}$ and the capacitors of the signal line, resulting in a controlled low to high voltage transition at the receiver end of the receiving transceiver. The controlled low to high voltage transition may have a magnitude that is proportional to a ratio of capacitance between the driver capacitor $C_{DRIVE}$ and the capacitors of the signal line. In addition, the controlled low to high voltage transition can be captured and sensed by a sense amplifier to determine the low to high signal transition by the receiver at the receiving transceiver. The transistors $M_1$, $M_2$, and the switch $S_1$ are controlled in the manner as described above for a low to high signal transition.

Figures 3C, 3D:
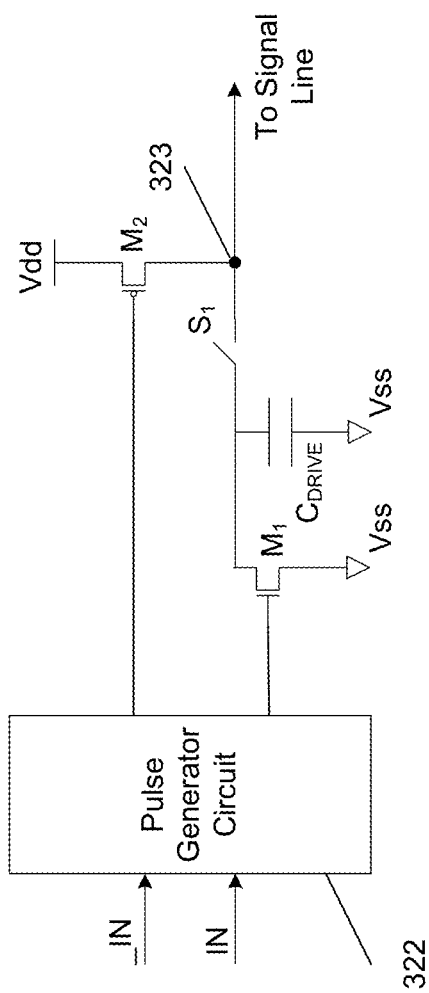

FIG. 3C illustrates another exemplary implementation of a transmitter of FIG. 2A according to aspects of the present disclosure. In the example shown in FIG. 3C, a transmitter may include a driver capacitor $C_{DRIVE}$, and a first transistor $M_1$ configured to discharge the driver capacitor $C_{DRIVE}$. The transmitter may further include a second transistor $M_2$ configured to charge a node 323 at the transmitter end of a signal line such as signal line 216. The transmitter may further include a switch $S_1$ configured to connect or separate the driver capacitor and the signal line during different phases of an operation. The transmitter further includes a pulse generator circuit 322 configured to generate control signals to control transistors $M_1$, $M_2$, and the switch $S_1$. The driver capacitor $C_{DRIVE}$, the first transistor $M_1$, the second transistor $M_2$, the switch $S_1$, and the pulse generator circuit 322 are connected in the manner shown in FIG. 3C.

During operation, to drive a high to low signal transition onto the signal line, in phase one with switch S1 open, the driver capacitor CDRIVE is discharged to logic low through the control of the M1 transistor while node 323 is charged to logic high through the control of M2 transistor. Then in phase two, switch S1 is closed, causing charge sharing among the driver capacitor CDRIVE and the capacitors of the signal line, resulting in a controlled high to low voltage transition at the receiver end of the receiving transceiver. The controlled high to low voltage transition may have a magnitude that is proportional to a ratio of capacitance between the driver capacitor CDRIVE and the capacitors of the signal line. In addition, the controlled high to low voltage transition can be captured and sensed by a sense amplifier to determine the high to low signal transition by the receiver at the receiving transceiver. The pulse generator circuit 322 generates control signals configured to control transistors M1, M2, and the switch S1, in the manner as described above for a high to low signal transition. The pulse generator circuit 322 is configured to generate a pulse onto the signal line based on the signal to be transmitted; and where a duration of the pulse is programmable.

FIG. 3D illustrates another exemplary implementation of a transmitter of FIG. 2A according to aspects of the present disclosure. In the example shown in FIG. 3D, a transmitter may include a driver capacitor $C_{DRIVE}$, and a first transistor $M_1$ configured to charge the driver capacitor $C_{DRIVE}$. The transmitter may further include a second transistor $M_2$ configured to discharge a node 325 at the transmitter end of a signal line such as signal line 216. The transmitter may further include a switch $S_1$ configured to connect or separate the driver capacitor $C_{DRIVE}$ and the signal line during different phases of an operation. The transmitter further includes a pulse generator circuit 324 configured to generate control signals to control transistors $M_1$, $M_2$, and the switch $S_1$. The driver capacitor $C_{DRIVE}$, the first transistor $M_1$, the second transistor $M_2$, the switch $S_1$, and the pulse generator circuit 324 are connected in the manner shown in FIG. 3D.

During operation, to drive a low to high signal transition onto the signal line, in phase one with switch $S_1$ open, the driver capacitor $C_{DRIVE}$ is charged to logic high through the control of the $M_1$ transistor while node 325 is discharged to logic low through the control of $M_2$ transistor. Then in phase two, switch $S_1$ is closed, causing charge sharing among the driver capacitor $C_{DRIVE}$ and the capacitors of the signal line, resulting in a controlled low to high voltage transition at the receiver end of the receiving transceiver. The controlled low to high voltage transition may have a magnitude that is proportional to a ratio of capacitance between the driver capacitor $C_{DRIVE}$ and the capacitors of the signal line. In addition, the controlled low to high voltage transition can be captured and sensed by a sense amplifier to determine the low to high signal transition by the receiver at the receiving transceiver. The pulse generator circuit 324 generates control signals configured to control transistors $M_1$, $M_2$, and the switch $S_1$, in the manner as described above for a low to high signal transition. The pulse generator circuit 324 is configured to generate a pulse onto the signal line based on the signal to be transmitted; and where a duration of the pulse is programmable.

Figure 3F:
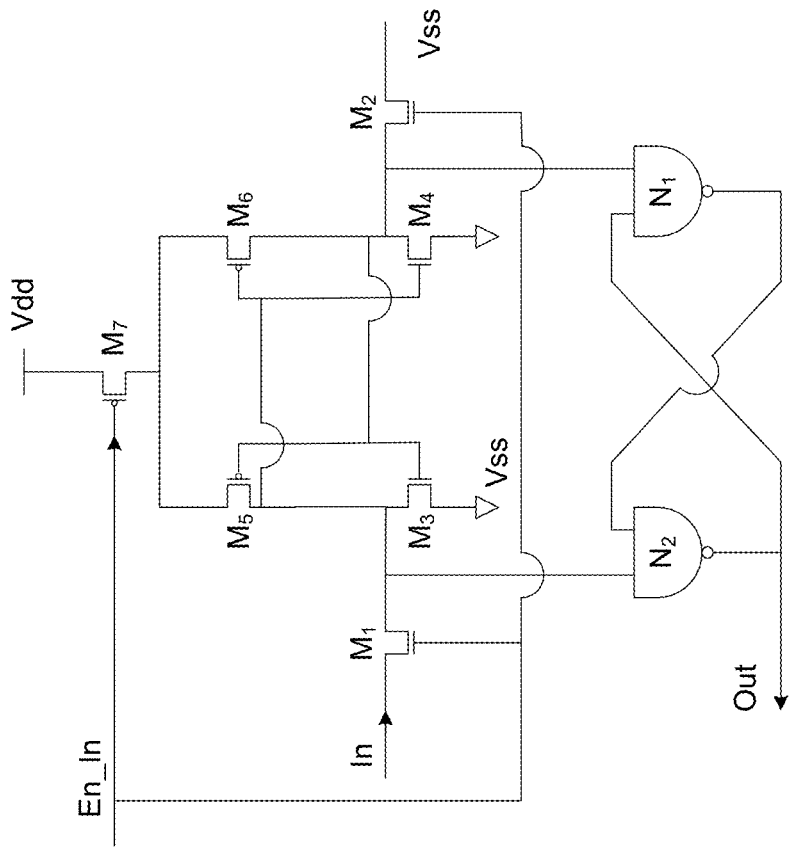
Figure 3E:
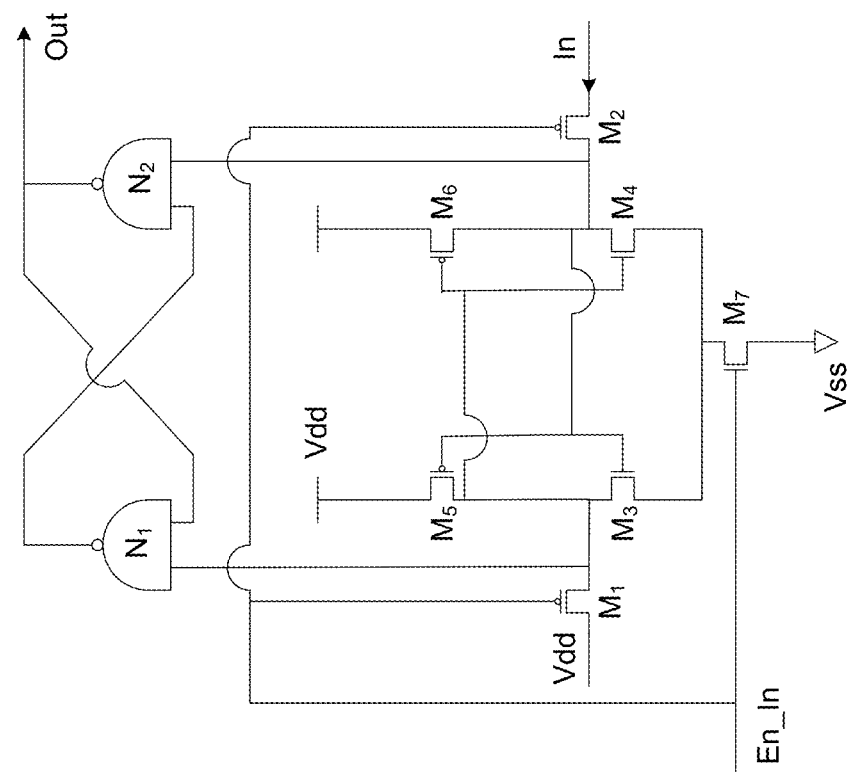

FIG. 3E illustrates an exemplary implementation of a receiver of FIG. 2A according to aspects of the present disclosure. As shown in FIG. 3E, a receiver may include transistors $M_1$, $M_2$, and $M_7$, a pair of cross-coupled inverters implemented by $M_3$, $M_4$, $M_5$ and $M_6$, a latch implemented by a pair of cross-coupled Nand gates $N_1$ and $N_2$. The transistors $M_1$, $M_2$, $M_3$, $M_4$, $M_5$, $M_6$, $M_7$, and the pair of cross-coupled Nand gates $N_1$ and $N_2$ are connected in the manner shown in FIG. 3E. The receiver receives an input signal (In) at transistor $M_2$, and a control signal (En_In) configured to control transistors $M_1$, $M_2$, and $M_7$. The receiver is configured to generate an output signal (Out). In some implementations, transistors $M_1$, $M_2$ may be replaced with switches.

FIG. 3F illustrates another exemplary implementation of a receiver of FIG. 2A according to aspects of the present disclosure. In the exemplary implementation of FIG. 3F, a receiver may include transistors $M_1$, $M_2$, and $M_7$, a pair of cross-coupled inverters implemented by $M_3$, $M_4$, $M_5$ and $M_6$, a latch implemented by a pair of cross-coupled Nand gates $N_1$ and $N_2$. The transistors $M_1$, $M_2$, $M_3$, $M_4$, $M_5$, $M_6$, $M_7$, and the pair of cross-coupled Nand gates $N_1$ and $N_2$ are connected in the manner shown in FIG. 3F. The receiver receives an input signal (In) at transistor $M_1$, and a control signal (En_In) configured to control transistors $M_1$, $M_2$, and $M_7$. The receiver is configured to generate an output signal (Out). In some implementations, transistors $M_1$, $M_2$ may be replaced with switches.

Figure 3G:
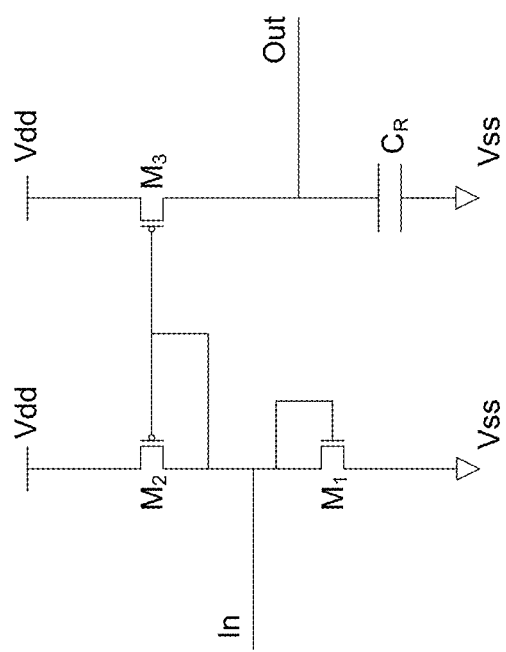

FIG. 3G illustrates yet another exemplary implementation of a receiver of FIG. 2A according to aspects of the present disclosure. In the example FIG. 3G, the receiver includes transistors $M_1$, $M_2$, $M_3$, and a receive capacitor $C_R$. The transistors $M_1$, $M_2$, $M_3$, receive capacitor $C_R$, an input signal (In), and an output signal Out are connected in the manner shown in FIG. 3G. According to aspects of the present disclosure, a transmitter circuit, such as the transmitter circuit of FIG. 3A or the transmitter circuit of FIG. 3C, is configured to cause a deviation in current at a receiver node of the signal line. A receiver circuit, such as the receiver circuit of FIG. 3E or the receiver circuit of FIG. 3F, is configured to reproduce the transmitted signal using the deviation in current at the receiver node of the signal line.

In this exemplary implementation, the receiver circuit includes a current mirror, formed by $M_2$ and $M_3$, configured to multiply the deviation in current detected at the receiver node (input In) of the signal line, the receive capacitor $C_R$ is configured to store charges produced by the current mirror, where the charges represent a signal strength of the transmitted signal.

FIG. 4A illustrates exemplary node voltages at an output node of a transmitter and an input node of a receiver based on a conventional implementation of low to high signal transition. As shown in FIG. 4A, line 402 represents a node voltage at an output node of a transmitter. Line 404 represents a node voltage at an input node of a receiver. The voltage at the output node of the transmitter can change quickly. However, due to the series of resistor-capacitor networks described above and the loading of the signal line, the voltage at the input node of the receiver can rise slowly. There can be a significant delay before the change in voltage at the input node of the receiver can be recognized. This delay is represented by the time $T_1$.

FIG. 4B illustrates exemplary node voltages at an output node of a transmitter and an input node of a receiver based on the implementation of FIG. 2A for a low to high signal transition according to aspects of the present disclosure. In the example of FIG. 4B, line 406 represents a node voltage at an output node of a transmitter. Line 408 represents a node voltage at an input node of a receiver. The voltage at the output node of the transmitter can change quickly. Since the transmitter circuit is configured to cause a deviation in voltage at a receiver node of the signal line and the receiver circuit is configured to detect the deviation in voltage from a reference voltage at the receiver node of the signal line, the magnitude of the voltage deviation, represented by Vs1 with respect to Vss, to be sensed at the receiver end is significantly reduced. Thus, a steady voltage of Vs1 at the input node of the receiver can be reached in significantly shorter time, represented by $T_2$. Note that the lines are shown for illustration purposes. In practice, the behavior of the node voltages can be non-linear and can vary in different design environments. Note that the lines are shown for illustration purposes and they are not drawn to scale. In practice, the behavior of the node voltages can be non-linear and can vary in different design environments.

Comparing FIG. 4B and FIG. 4A, the time delay ($T_2$ vs $T_1$) before the receiver can start sensing a low to high signal transition on the signal line can be significantly reduced with the disclosed implementation, which can lead to significant improvement in performance of the system. In addition, comparing the amount of voltage change at the input node of the receiver (line 408 vs line 404), the amount of voltage swing on the signal line can be significantly reduced with the disclosed implementation, and this reduction in voltage swing can result in power savings for the system.

FIG. 4C illustrates another exemplary node voltages at an output node of a transmitter and an input node of a receiver based on a conventional implementation of high to low signal transition. In the example shown in FIG. 4C, line 412 represents a node voltage at an output node of a transmitter. Line 414 represents a node voltage at an input node of a receiver. The voltage at the output node of the transmitter can change quickly. However, due to the series of resistor-capacitor networks described above and the loading of the signal line, the voltage at the input node of the receiver can decrease slowly. There can be a significant delay before the change in voltage at the input node of the receiver can be recognized. This delay is represented by the time $T_3$.

FIG. 4D illustrates another exemplary node voltages at an output node of a transmitter and an input node of a receiver based on the implementation of FIG. 2A for a high to low signal transition according to aspects of the present disclosure. As shown in FIG. 4D, line 416 represents a node voltage at an output node of a transmitter. Line 418 represents a node voltage at an input node of a receiver. The voltage at the output node of the transmitter can change quickly. Since the transmitter circuit is configured to cause a deviation in voltage at a receiver node of the signal line and the receiver circuit is configured to detect the deviation in voltage from a reference voltage at the receiver node of the signal line, the magnitude of the voltage deviation, represented by Vs2 with respect to Vdd, to be sensed at the receiver end is significantly reduced. Thus, a steady voltage of Vs2 at the input node of the receiver can be reached in significantly shorter time, represented by $T_4$. Note that the lines are shown for illustration purposes and they are not drawn to scale. In practice, the behavior of the node voltages can be non-linear and can vary in different design environments.

Comparing FIG. 4D and FIG. 4C, the time delay ($T_4$ vs $T_3$) before the receiver can start sensing a high to low signal transition on the signal line can be significantly reduced with the disclosed implementation, which can lead to significant improvement in performance of the system. In addition, comparing the amount of voltage change at the input node of the receiver (line 418 vs line 414), the amount of voltage swing on the signal line can be significantly reduced with the disclosed implementation, and this reduction in voltage swing can result in power savings for the system.

FIG. 4E illustrates yet another exemplary node voltages at an output node of a transmitter and an input node of a receiver based on the implementation of FIG. 3C for a low to high signal transition. In the example shown in FIG. 4E, line 422 represents a node voltage at an output node of a transmitter based on the exemplary implementation FIG. 3C for a low to high signal transition. Line 424 represents a node voltage at an input node of a receiver based on the exemplary implementation FIG. 3C for a low to high signal transition. With the pulse generator circuit 322, the duration of the signal being driven onto the signal line by the transmitter circuit can be further reduced, which can result in further savings in power consumption. In this example, the receiver may be configured to sense the voltage deviation Vs1 with respect to Vss at time $T_5$. The transmitter circuit can stop driving the signal line after a duration controlled by the pulse generator circuit, for example after time $T_6$. At $T_7$, the input node at the receiver may be returned to a standby state, which is Vss in this example. Besides the differences introduced by the pulse generator circuit 322, the behavior of the transmission mechanism is similar to that of FIG. 4B, and the description is not repeated here.

FIG. 4F illustrates yet another exemplary node voltages at an output node of a transmitter and an input node of a receiver based on the implementation of FIG. 3C for a high to low signal transition. As shown in FIG. 4F, line 426 represents a node voltage at an output node of a transmitter based on the exemplary implementation FIG. 3C for a low to high signal transition. Line 428 represents a node voltage at an input node of a receiver based on the exemplary implementation FIG. 3C for a low to high signal transition. With the pulse generator circuit 322, the duration of the signal being driven onto the signal line by the transmitter circuit can be further reduced, which can result in further savings in power consumption. In this example, the receiver may be configured to sense the voltage deviation Vs2 with respect to Vdd at time $T_8$. The transmitter circuit can stop driving the signal line after a duration controlled by the pulse generator circuit, for example after time $T_9$. At $T_{10}$, the input node at the receiver may be returned to a standby state, which is Vdd in this example. Besides the differences introduced by the pulse generator circuit 322, the behavior of the transmission mechanism is similar to that of FIG. 4D, and the description is not repeated here.

Figure 4G:
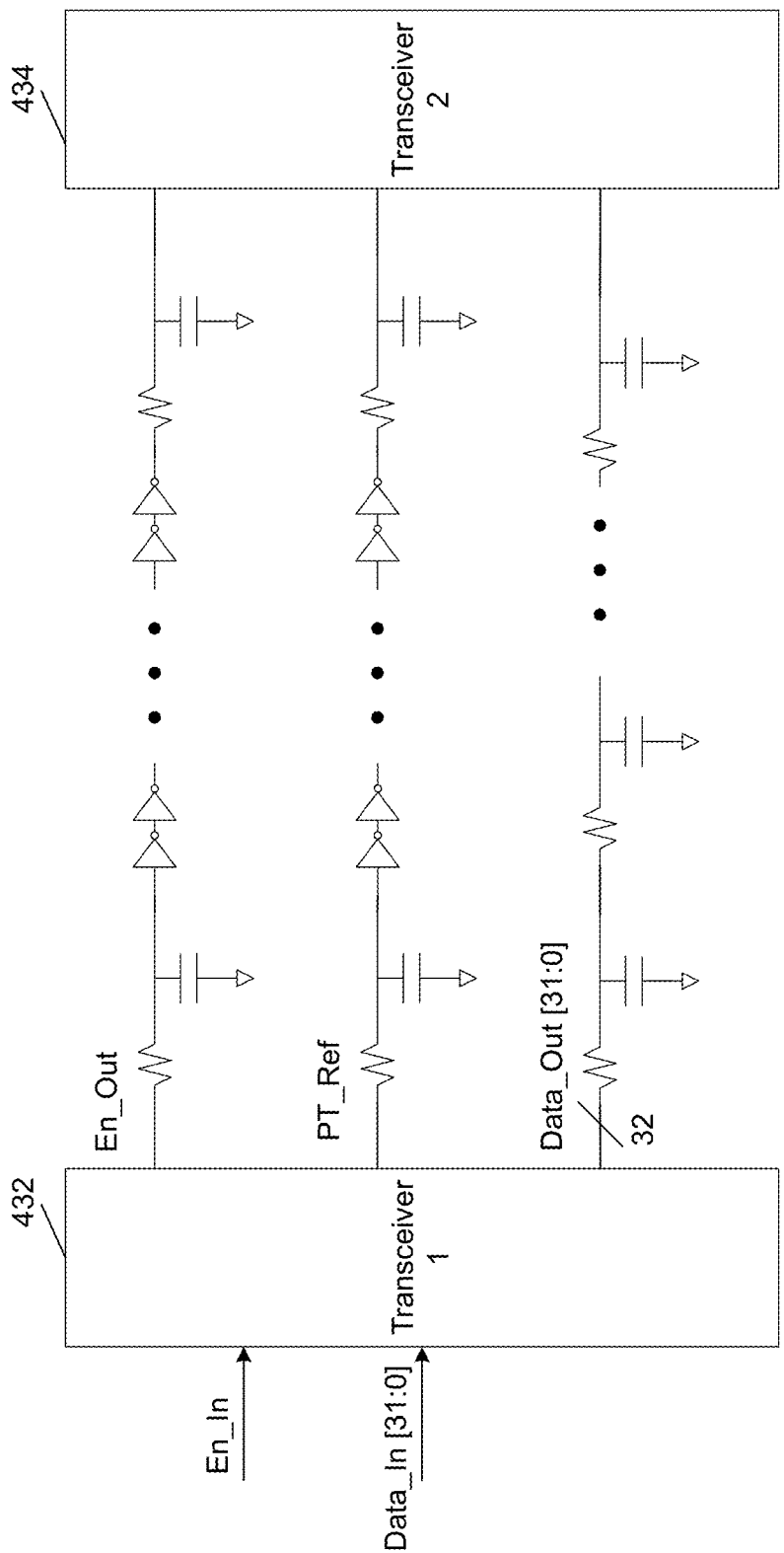
FIG. 4G illustrates an exemplary implementation of a data bus and its control signals according to aspects of the present disclosure.

FIG. 4G illustrates an exemplary implementation of a data bus and its control signals according to aspects of the present disclosure. In the exemplary implementation shown in FIG. 4G, transceiver 1 (432) is configured to communicate with transceiver 2 (434) using a signal bus. Transceiver 1 receives a 32-bit input data (Data_in) and a control signal Enable_In (En_In), and produces a 32-bit output data (Data_Out), along with control signals (En_Out) and an optional pre-charge timing reference (PT_Ref). In some implementations, each line of the 32-bit output Data_Out is transmitted using the mechanism and/or circuits described in association with FIG. 2A-2B, FIG. 3A-3E, and FIG. 4B, 4D-4F. In some implementations, the control signals En_out and PT_Ref may be communicated to transceiver 2 using a conventional buffering mechanism. The PT_Ref signal is configured to assist the receiver about the timing and state of charging and/or discharging of the output node at the transmitter of transceiver 1, for example in implementations described in association with FIG. 4E and FIG. 4F.

FIG. 5A illustrates an exemplary method of signal communication between a transmitter and a receiver according to aspects of the present disclosure. As shown in FIG. 5A, in block 502, the method drives a transmitted signal onto a signal line. In block 504, the method detects the transmitted signal based on a deviation of a received signal from a reference signal on the signal line. In block 506, the method uses the received signal to communicate the transmitted signal. In some implementations, the signal line is configured to transmit bi-directional signals for different periods of signal transmission. An amount of deviation of the signal from the reference signal to be detected by the receiver is programmable.

Figure 5B:
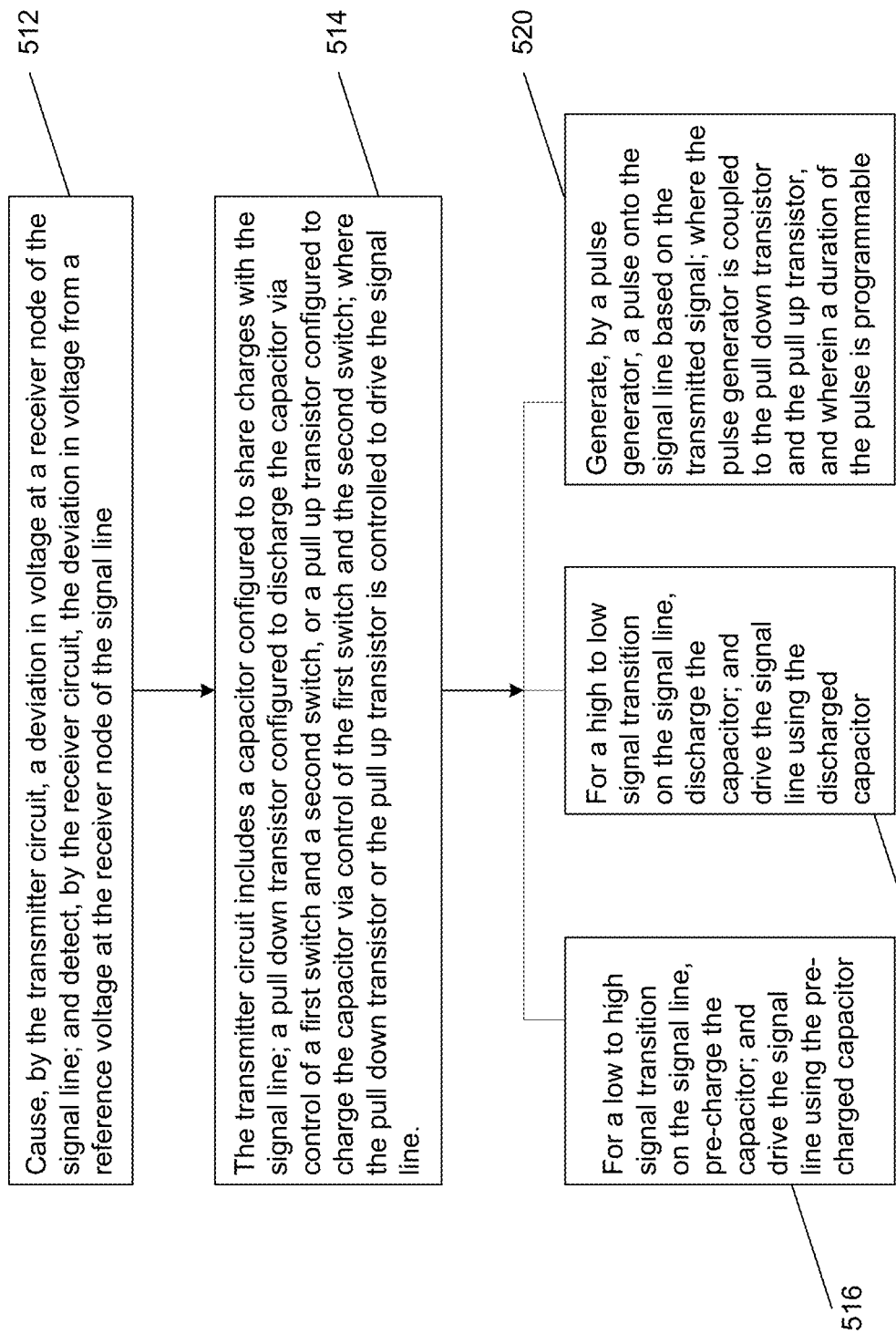
FIG. 5B illustrates another exemplary method of signal communication between a transmitter and a receiver according to aspects of the present disclosure.

FIG. 5B illustrates another exemplary method of signal communication between a transmitter and a receiver according to aspects of the present disclosure. In the exemplary implementation of FIG. 5B, in block 512, the method causes, by the transmitter circuit, a deviation in voltage at a receiver node of the signal line; and detects, by the receiver circuit, the deviation in voltage from a reference voltage at the receiver node of the signal line. In block 514, the transmitter circuit includes a capacitor configured to share charges with the signal line; a pull down transistor configured to discharge the capacitor via control of a first switch and a second switch, or a pull up transistor configured to charge the capacitor via control of the first switch and the second switch; where the pull down transistor or the pull up transistor is controlled to drive the signal line.

According to aspects of the present disclosure, the methods performed in blocks 512 and 514 may additionally and/or optionally include the methods performed in blocks 516, 518, and 520. In block 516, for a low to high signal transition on the signal line, the method pre-charges the capacitor and drives the signal line using the pre-charged capacitor. In block 518, for a high to low signal transition on the signal line, the method discharges the capacitor and drives the signal line using the discharged capacitor. In block 520, the method generates, by a pulse generator, a pulse onto the signal line based on the transmitted signal; where the pulse generator is coupled to the pull down transistor and the pull up transistor, and where a duration of the pulse is programmable.

Figures 5C, 5D:
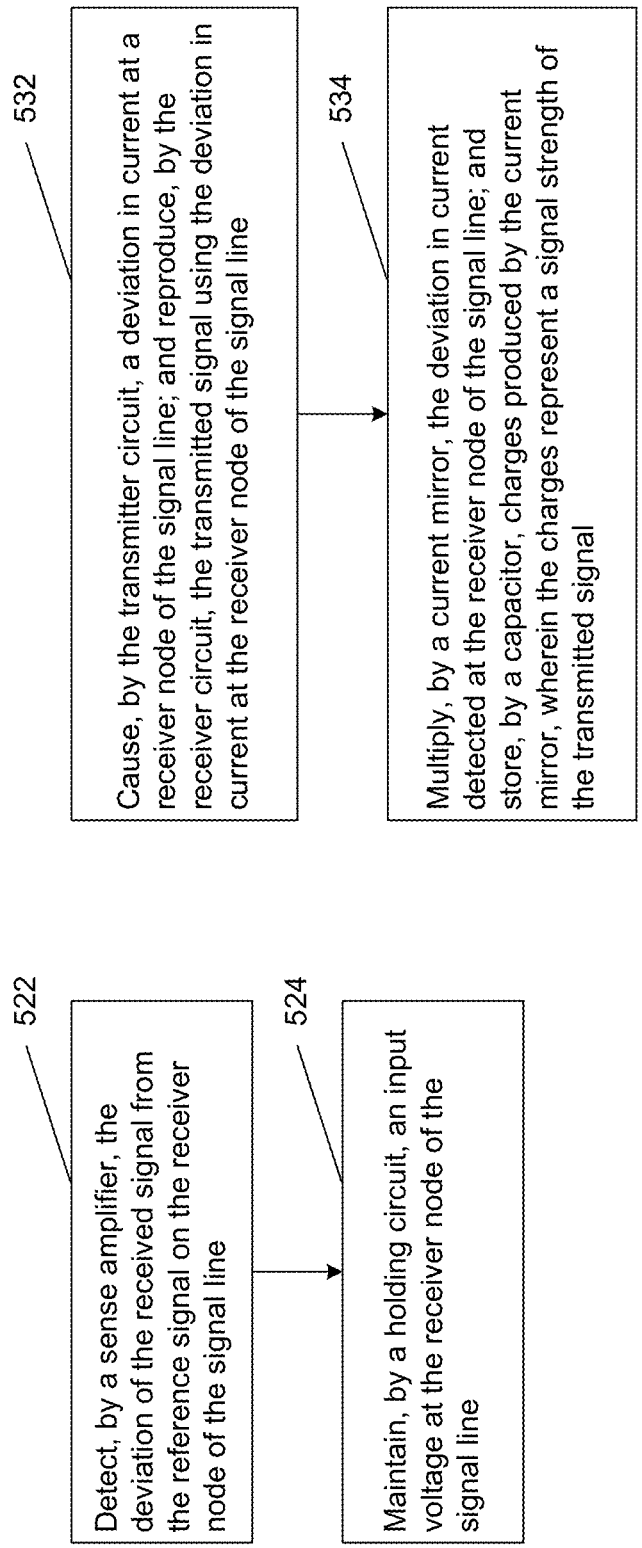
FIG. 5C illustrates an exemplary method of detecting a transmitted signal according to aspects of the present disclosure.
FIG. 5D illustrates yet another exemplary method of signal communication between a transmitter and a receiver according to aspects of the present disclosure.

FIG. 5C illustrates an exemplary method of detecting a transmitted signal according to aspects of the present disclosure. As shown in the example of FIG. 5C, in block 522, the method detects, by a sense amplifier, the deviation of the received signal from the reference signal on the receiver node of the signal line. In some implementations, the method performed in block 522 may additionally and/or optionally include the method performed in block 524. In block 524, the method maintains, by a holding circuit, an input voltage at the receiver node of the signal line.

FIG. 5D illustrates yet another exemplary method of signal communication between a transmitter and a receiver according to aspects of the present disclosure. In the example of FIG. 5D, in block 532, the method causes, by the transmitter circuit, a deviation in current at a receiver node of the signal line; and reproduces, by the receiver circuit, the transmitted signal using the deviation in current at the receiver node of the signal line. In some implementations, the method performed in block 532 may additionally and/or optionally include the method performed in block 534. In block 534, the method multiplies, by a current mirror, the deviation in current detected at the receiver node of the signal line; and stores, by a capacitor, charges produced by the current mirror, where the charges represent a signal strength of the transmitted signal.

Figure 6A:
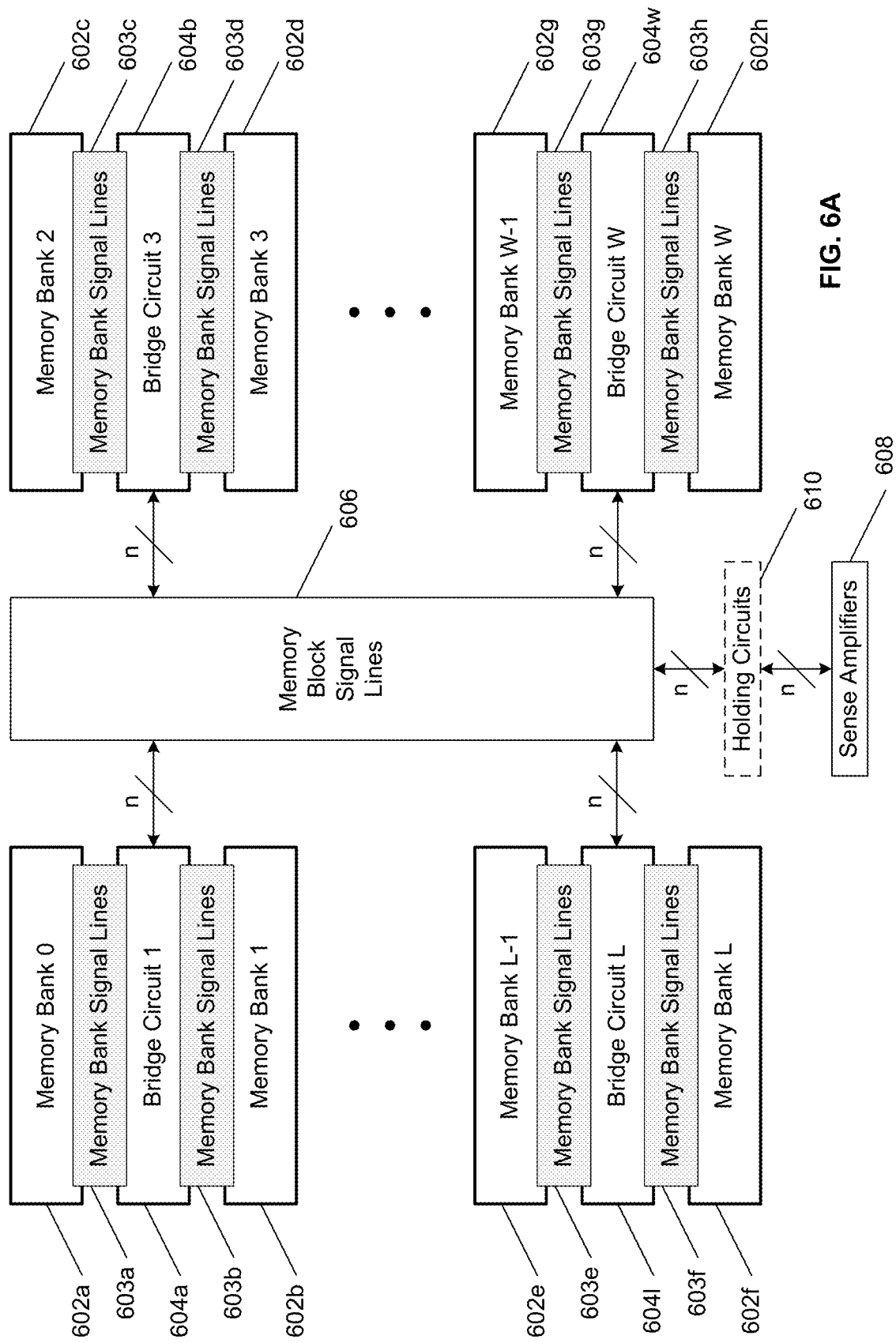
FIG. 6A illustrates an exemplary implementation of a SRAM according to aspects of the present disclosure.

FIG. 6A illustrates an exemplary implementation of a SRAM according to aspects of the present disclosure. A SRAM may include a plurality of memory blocks. A memory block in the plurality of memory blocks may include a plurality memory banks, such as memory banks 0 through 3, memory bank L-1, memory bank L, memory bank W-1, and memory bank W, labelled 602a through 602h, respectively. A memory bank in the plurality of memory banks includes a plurality bit cells, such as the bit cell shown in FIG. 1E. In this particular implementation, two adjacent memory banks may share a bridge circuit. For example, memory bank 0 and memory bank 1 share bridge circuit 1 (labeled as 604a).

In the exemplary implementation of FIG. 6A, a block of a SRAM may include a set of memory bank signal lines, labelled as 603a through 603h, and a corresponding bridge circuit. A bit cell in a memory bank can be accessed through the set of memory bank signal lines. The block of a SRAM may further include a set of memory block signal lines 606 shared across the plurality of memory banks in the memory block through bridge circuits (such as 604a, 604b, 604l and 604w) couple between the set of memory bank signal lines and the set of memory block signal lines 606. As described in association with FIG. 1D, the set of memory bank signal lines includes a plurality of differential bit lines. The block of a SRAM may further include a set of sense amplifiers 608 corresponding to the set of memory block signal lines and additionally/optionally include holding circuits, such as holding circuit 610, where the set of sense amplifiers are shared among the plurality of memory banks in the memory block. A controller (not shown) may be used to control an access of one or more bit cells in the plurality bit cells. The controller may include an address decoder configured to generate control signals to the bridge circuit and the plurality bit cells.

Figure 6B:
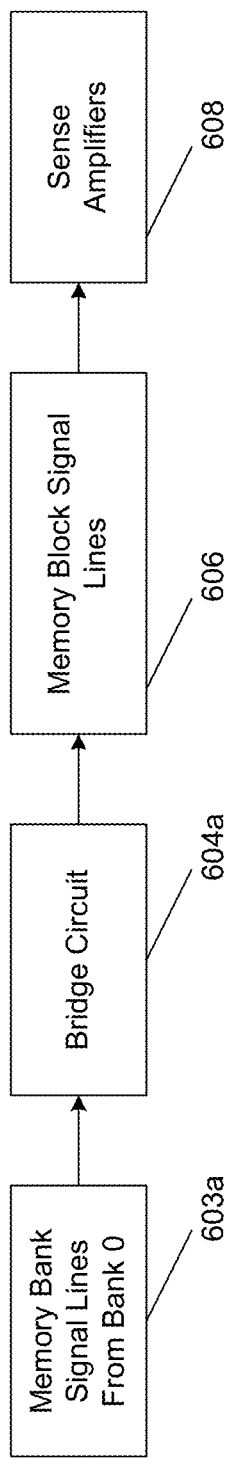
FIG. 6B illustrates an exemplary implementation of SRAM signal lines according to aspects of the present disclosure.

FIG. 6B illustrates an exemplary implementation of SRAM signal lines according to aspects of the present disclosure. In the example of FIG. 6B, a signal path of FIG. 6A is shown, for example from memory bank 0 (602a) via bank signal lines (603a), bridge circuit (604a), memory block signal lines 606, to sense amplifiers 608. According to aspects of the present disclosure, the bridge circuit 604a can be configured to disconnect the set of memory bank signal lines 603a and the set of memory block signal lines 606 during a standby mode of a memory bank, such as memory bank 0 or memory bank 1. The bridge circuit 604a can be further configured to connect the set of memory bank signal lines 603a and the set of memory block signal lines 606 during an access mode of a memory bank. In addition, the bridge circuit 604a can be configured to cause a deviation in voltage in the plurality pairs of differential bit lines in a memory bank. The set of sense amplifiers 608 can be configured to detect the deviation in voltage in the plurality pairs of differential bit lines, as described above in association with FIG. 3A-3E and FIG. 4A-4F.

Figure 6C:
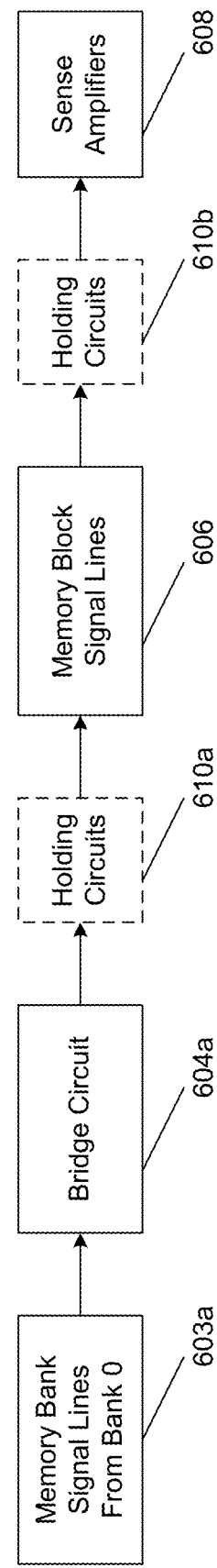
FIG. 6C illustrates another exemplary implementation of SRAM signal lines according to aspects of the present disclosure.

FIG. 6C illustrates another exemplary implementation of SRAM signal lines according to aspects of the present disclosure. Similar to the example to FIG. 6B, a signal path of FIG. 6A is shown, for example from memory bank 0 via bank signal lines 603a, bridge circuit (604a), a first optional holding circuit 610a, memory block signal lines 606, a second optional holding circuits 610b, to sense amplifiers 608. A holding circuit, such as 610a or 610b, can be configured to maintain a voltage at an output node of the bridge circuit 604a or at an input node of a sense amplifier 608. The set of sense amplifiers 608 can be configured to detect the deviation in voltage in the plurality pairs of differential bit lines, as described above in association with FIG. 3A-3E and FIG. 4A-4F. In addition, a sense amplifier may include a differential amplifier configured to detect a voltage differential from a pair of memory block signal lines.

FIG. 6D illustrates an exemplary bridge circuit according to aspects of the present disclosure. In the example of FIG. 6D, an implementation of handling one bit of a signal line in the bridge circuit is shown. A bridge circuit may include a pull up transistor $M_1$, a switch S, and a pull down transistor $M_2$. The pull up transistor $M_1$, switch S, and pull down transistor $M_2$ are connected in the manner as shown in FIG. 6D. The pull-up transistor $M_1$ can be configured to charge the memory bank signal line, and the pull up transistor M1 can also be controlled to drive the memory block signal line.

In some implementations, for a read operation, the bridge circuit can be configured to pre-charge a pair of memory bank sign lines to a logic high, where the pair of memory bank sign lines includes a bit line and an inverse of the bit line of a row of bit cells to be read. Upon completing pre-charging the pair of memory bank sign lines, a word line can be activated to control the row of bit cells, where each bit cell is coupled to a pair of memory bank sign lines, which are connected to a pair memory block sign lines via the bridge circuit.

With the above implementation, charges stored in the pre-charged pair of memory bank sign lines are shared with the capacitors (as shown in the signal line model of FIG. 1A) of the pair memory block sign lines via the bridge circuit. This sharing of charges causes a deviation in voltage or current at the input node(s) of a sense amplifier. The sense amplifier is configured to sense the voltage differential or current differential of the pair of memory block signal lines caused by the shared charges from the pre-charged pair of memory bank sign lines to determine a value stored in the bit cell based on an outcome of the sense amplifier.

FIG. 6E illustrates another exemplary bridge circuit according to aspects of the present disclosure. In the example of FIG. 6E, an implementation of handling one bit of a signal line in the bridge circuit is shown. A bridge circuit may include a pull up transistor $M_1$, a first switch $S_1$, and a pull down transistor $M_2$. The bridge circuit may further include a driver capacitor $C_D$, a second switch $S_2$, and a local sense amplifier 612.

The pull up transistor $M_1$, drive capacitor $C_D$, switch S, pull down transistor $M_2$, driver capacitor $C_D$, a second switch $S_2$, and a local sense amplifier 612 are connected in the manner as shown in FIG. 6E. The pull-up transistor $M_1$ can be configured to charge the memory bank signal line, and the pull up transistor M1 can also be controlled to drive the memory block signal line. The local sense amplifier 612 can be configured to control the second switch $S_2$ and to control the pre-charge of the driver capacitor $C_D$.

In some implementations, for a read operation, the bridge circuit can be configured to pre-charge the driver capacitor $C_D$ as well as to pre-charge a pair of memory bank sign lines to a logic high, where the pair of memory bank sign lines includes a bit line and an inverse of the bit line of a row of bit cells to be read. Upon completing pre-charging the driver capacitor $C_D$ and the pair of memory bank sign lines, a word line can be activated to control the row of bit cells, where each bit cell is coupled to a pair of memory bank sign lines, which are connected to a pair memory block sign lines via the bridge circuit.

With the above implementation, charges stored in the driver capacitor $C_D$ and the pre-charged pair of memory bank sign lines are shared with the capacitors (as shown in the signal line model of FIG. 1A) of the pair memory block sign lines via the bridge circuit. This sharing of charges causes a deviation in voltage or current at the input node(s) of a sense amplifier, such as sense amplifier 608. The sense amplifier is configured to sense the voltage differential or current differential of the pair of memory block signal lines caused by the shared charges from the pre-charged pair of memory bank sign lines to determine a value stored in the bit cell based on an outcome of the sense amplifier.

FIG. 6F illustrates an exemplary holding circuit according to aspects of the present disclosure. In the example of FIG. 6F, an implementation of handling one bit of the signal line in the holding circuit is shown. A holding circuit may include a NMOS transistor $M_3$, a PMOS transistor $M_4$, a first resistor $R_1$, and a second resistor $R_2$. The NMOS transistor $M_3$, PMOS transistor $M_4$, first resistor $R_1$, and second resistor $R_2$ are connected in the manner as shown in FIG. 6F. Applying to the example of holding circuit 610b in FIG. 6C, the gate terminal of the NMOS transistor $M_3$ receives an input (labeled as Vin) from a memory block signal line and the drain terminal of the PMOS transistor $M_4$ produces an output (labelled as Vout) to an input of a sense amplifier.

Figure 1C:
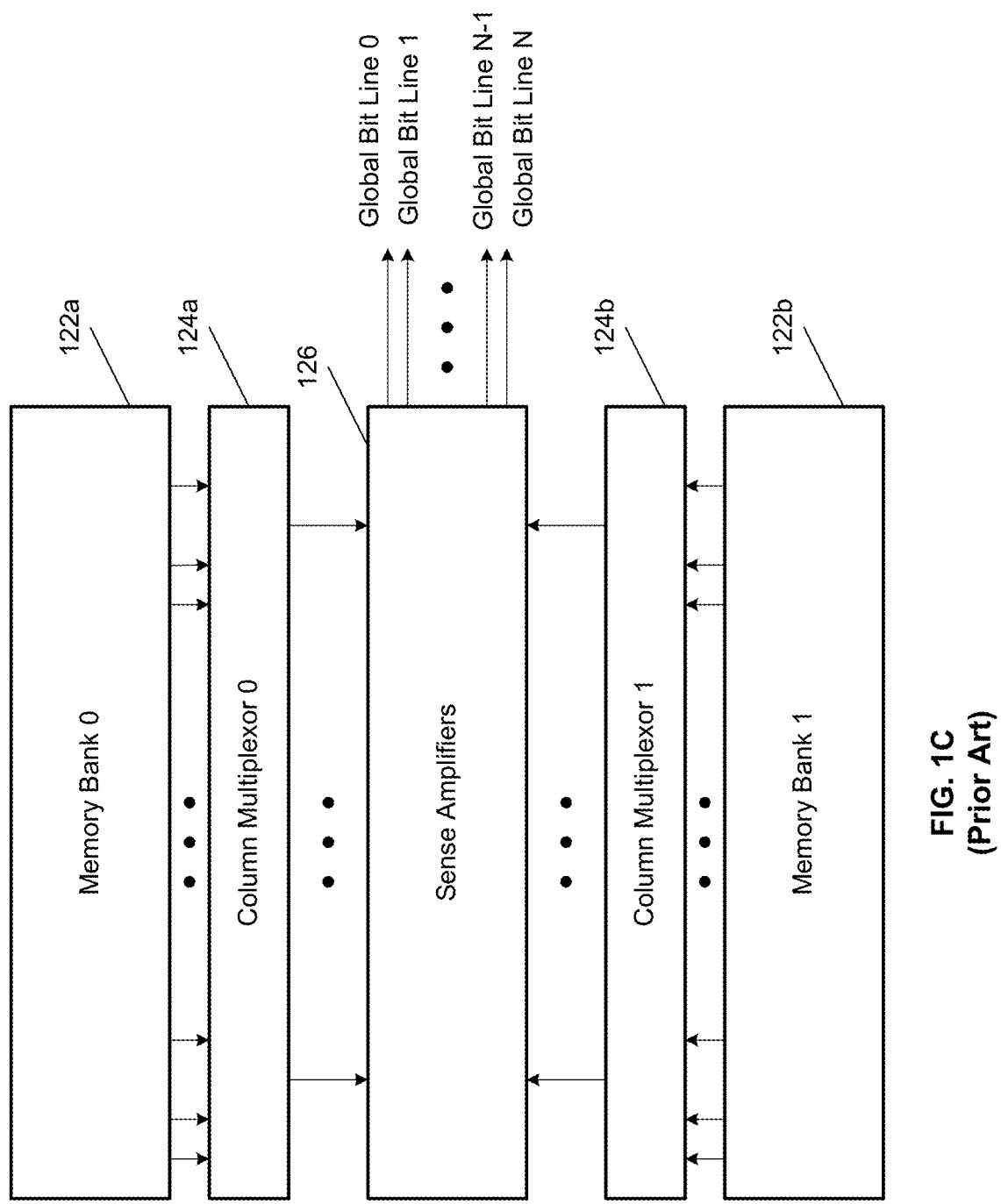
FIG. 1C illustrates a conventional design of a SRAM data signals.
Figure 1D:
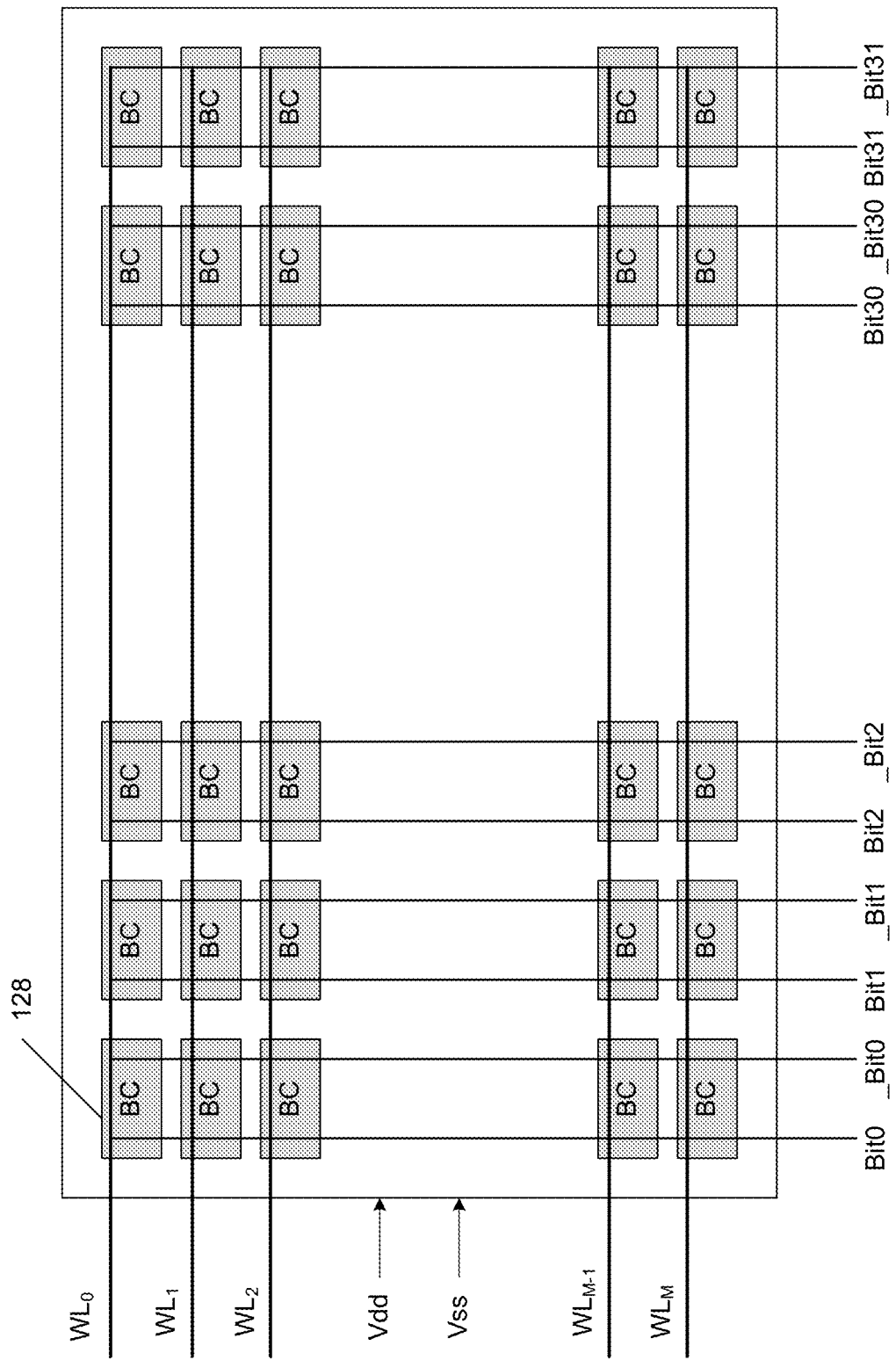
FIG. 1D illustrates a conventional design of a SRAM memory bank of FIG. 1C.
Figure 1E:
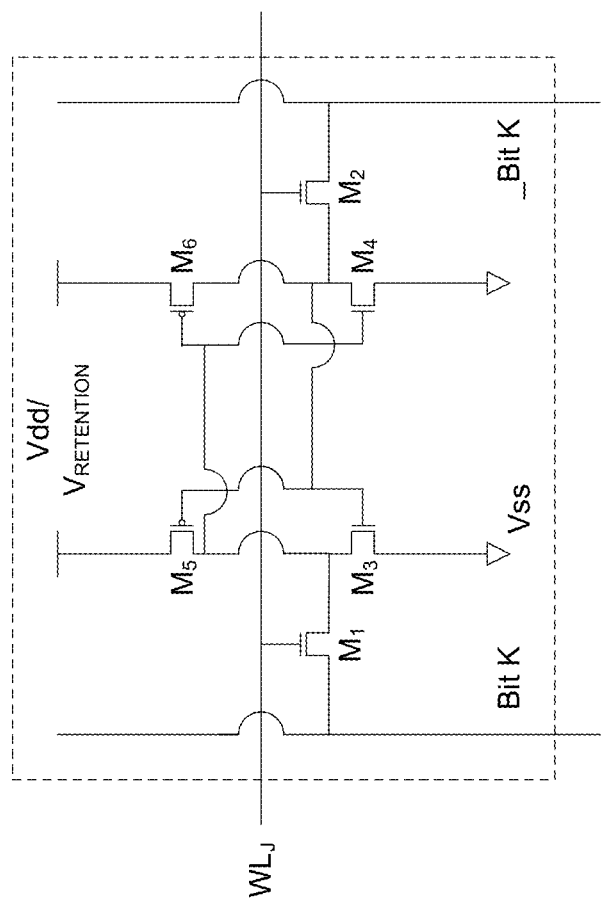
FIG. 1E illustrates a conventional design of a bit cell of a SRAM.

The disclosed SRAM designs of FIG. 6A-6F have a number of advantages over the conventional SRAM design of FIG. 1C. First, the disclosed SRAM design has eliminated the column multiplexors of the conventional design. Second, the sense amplifiers are shared among a larger set of memory banks as opposed to be shared among two memory banks. Both of the above improvements result in saving in area/size of the integrated circuit used in implementing the SRAM. Moreover, through the mechanism of charge sharing, the time delay before a sense amplifier can start sensing a high to low signal transition can be significantly reduced with the disclosed implementation, which can lead to significant improvement in performance of the SRAM. Furthermore, due to the low range of voltage swing at the inputs of the sense amplifiers, this improvement can result in power savings for the SRAM.

Figure 7A:
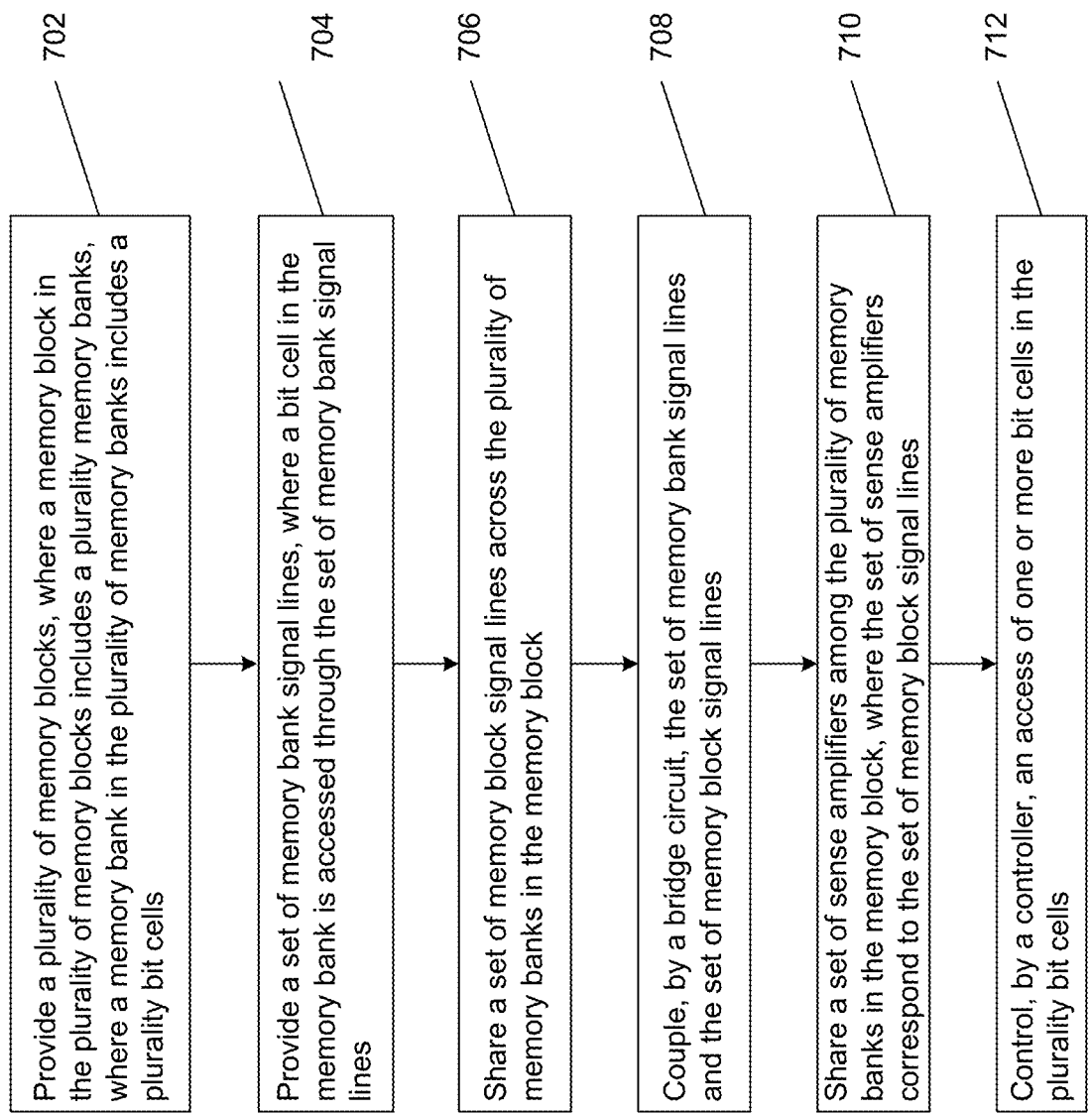
FIG. 7A illustrates an exemplary method of reducing dynamic power in a SRAM according to aspects of the present disclosure.

FIG. 7A illustrates an exemplary method of reducing dynamic power in a SRAM according to aspects of the present disclosure. In the example shown in FIG. 7A, in block 702, the method provides a plurality of memory blocks, where a memory block in the plurality of memory blocks includes a plurality memory banks, where a memory bank in the plurality of memory banks includes a plurality bit cells. In block 704, the method provides a set of memory bank signal lines, where a bit cell in the memory bank is accessed through the set of memory bank signal lines. In block 706, the method shares a set of memory block signal lines across the plurality of memory banks in the memory block. In block 708, the method bridges, by a bridge circuit, between the set of memory bank signal lines and the set of memory block signal lines. In block 710, the method shares a set of sense amplifiers among the plurality of memory banks in the memory block, where the set of sense amplifiers correspond to the set of memory block signal lines. In block 712, the method controls, by a controller, an access of one or more bit cells in the plurality bit cells.

FIG. 7B illustrates an exemplary implementation of bridging between a set of memory bank signal lines and a set of memory block signal lines according to aspects of the present disclosure. As shown in the exemplary implementation of FIG. 7B, in block 722, the method disconnects, by the bridge circuit, the set of memory bank signal lines and the set of memory block signal lines during a standby mode of the memory bank; and connects, by the bridge circuit, the set of memory bank signal lines and the set of memory block signal lines during an access mode of the memory bank. The set of memory bank signal lines includes a plurality pairs of differential bit lines.

In some implementations, the methods performed in block 722 may further include the methods performed in block 724. In block 724, the method causes, by the bridge circuit, a deviation in voltage in the plurality pairs of differential bit lines; and detects, by the set of sense amplifiers, the deviation in voltage in the plurality pairs of differential bit lines, where the bridge circuit includes a set of pull up transistors configured to charge the set of memory bank signal lines and controlled to drive the set of memory block signal lines.

In some implementations, the methods performed in block 724 may further include the methods performed in block 726; and the methods performed in block 726 may further include the methods performed in block 728. In block 726, for each sense amplifier in the set of sense amplifiers, the method detects, by a differential amplifier, a voltage differential from a pair of memory block signal lines. In block 728, the method maintains, by a holding circuit, an input voltage at an input node of the sense amplifier.

FIG. 7C illustrates an exemplary method of performing a read operation of a SRAM according to aspects of the present disclosure. As shown in FIG. 7C, in block 732, for a read operation, the method pre-charges, by a bridge circuit, a pair of memory bank sign lines to a logic high, where the pair of memory bank sign lines includes a bit line and an inverse of the bit line of a bit cell to be read; upon completing pre-charging the pair of memory bank sign lines, activates, by a controller, a word line to control the bit cell, and connects, by the bridge circuit, the pair of memory bank sign lines to a pair memory block sign lines.

In some implementations, the methods performed in block 732 may further include the methods performed in block 734. In block 734, the method shares, by the bridge circuit, charges stored in the pre-charged pair of memory bank sign lines with the pair memory block sign lines, senses, by the sense amplifier, the voltage differential of the pair of memory block signal lines caused by the shared charges from the pre-charged pair of memory bank sign lines, and determines, by the sense amplifier, a value stored in the bit cell based on a sensed outcome.

FIG. 8A illustrates an exemplary implementation of controlling a bit cell in a SRAM according to aspects of the present disclosure. A SRAM may include a plurality of memory blocks. A memory block in the plurality of memory blocks may include a plurality memory banks. A memory bank in the plurality of memory banks may include a plurality bit cells. As shown in the exemplary implementation of FIG. 8A, a bit cell 802 of a SRAM may be controlled by a controller 804 and a bias circuit 806. A bias circuit 806 can be configured to couple to a circuit ground terminal of the bit cell 802, where the bias circuit 806 can be configured to produce a bias voltage to the bit cell 802. The controller 804 can be configured to control the bias circuit 806 to produce a first set of bias settings in an access mode; and control the bias circuit 806 with a second set of bias settings in a standby mode of the bit cell in the SRAM.

FIG. 8B illustrates an exemplary implementation of generating a bias voltage to circuit ground of a bit cell in a SRAM according to aspects of the present disclosure. In the example of FIG. 8B, a bias circuit may include a first transistor $M_1$ and a second transistor $M_2$, a reference voltage generator 808. The first transistor $M_1$ is configured to pull down a bias voltage to the circuit ground of the bit cell during an access mode of the bit cell 802. The second transistor $M_2$ is configured to pull up the bias voltage to a first reference voltage during a standby mode of the bit cell 802. The reference voltage generator 808 is configured to generate the corresponding bias voltage during the access mode and during the standby mode of the bit cell 802. The bias control is provided by controller 804 and the bias voltage is provided to the Vss (also referred to as circuit ground) line of the bit cell 802. According aspects of the present disclosure, the first reference voltage can be programmable.

FIG. 8C illustrates an exemplary implementation of controlling a word line of a bit cell in a SRAM according to aspects of the present disclosure. In FIG. 8C, the word line control circuit may include a first transistor $M_1$ and a second transistor $M_2$. The controller may be configured to control the word line by asserting the word line (pull up though $M_2$) to select the bit cell during an access mode, and de-assert the word line (pull down through $M_1$) to de-select the bit cell during a standby mode.

Figure 8D:
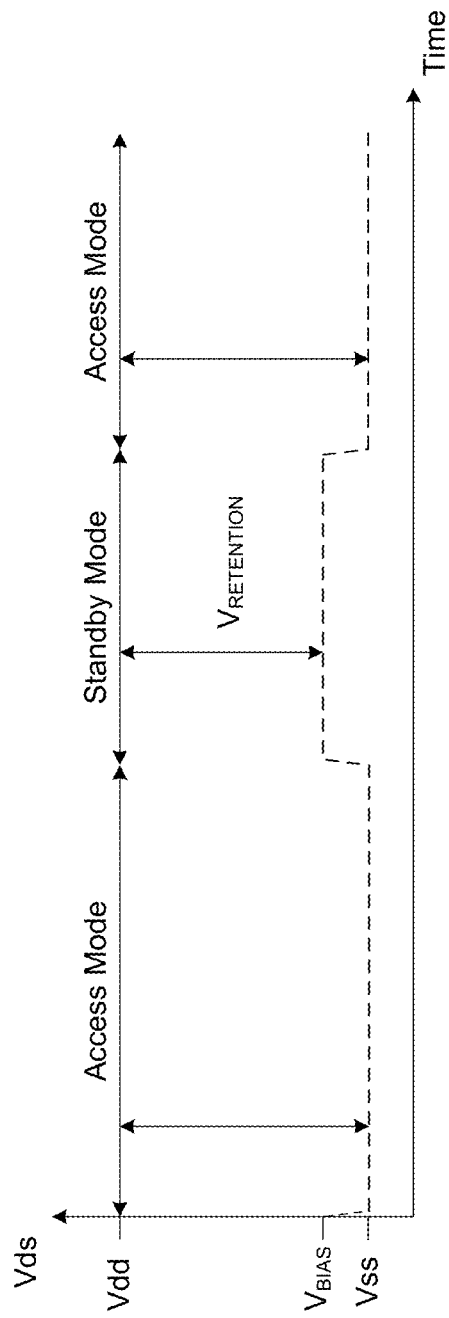
FIG. 8D illustrates an exemplary plot of drain to source voltage of a NMOS transistor in a bit cell of a SRAM according to aspects of the present disclosure.

FIG. 8D illustrates an exemplary plot of drain to source voltage of a NMOS transistor in a bit cell of a SRAM according to aspects of the present disclosure. In the example of FIG. 8D, a voltage differential across a bit cell may be controlled by setting a bias voltage $V_{BIAS}$ as described above in FIG. 8A-8C. During an access mode of a bit cell, the bias voltage is set to Vss. As a result, the voltage differential across a bit cell is Vdd–Vss. During a standby mode, where the word line of a bit cell is not asserted (i.e. the bit cell is not selected), the bias voltage is set to $V_{BIAS}$. As a result, the voltage differential across a bit cell is Vdd–$V_{BIAS}$, which can be a desirable retention voltage $V_{RETENTION}$ for the bit cell when it is not in operation. The voltage differential across a bit cell can be switched back to Vdd–Vss for a subsequent access mode.

Figure 1F:
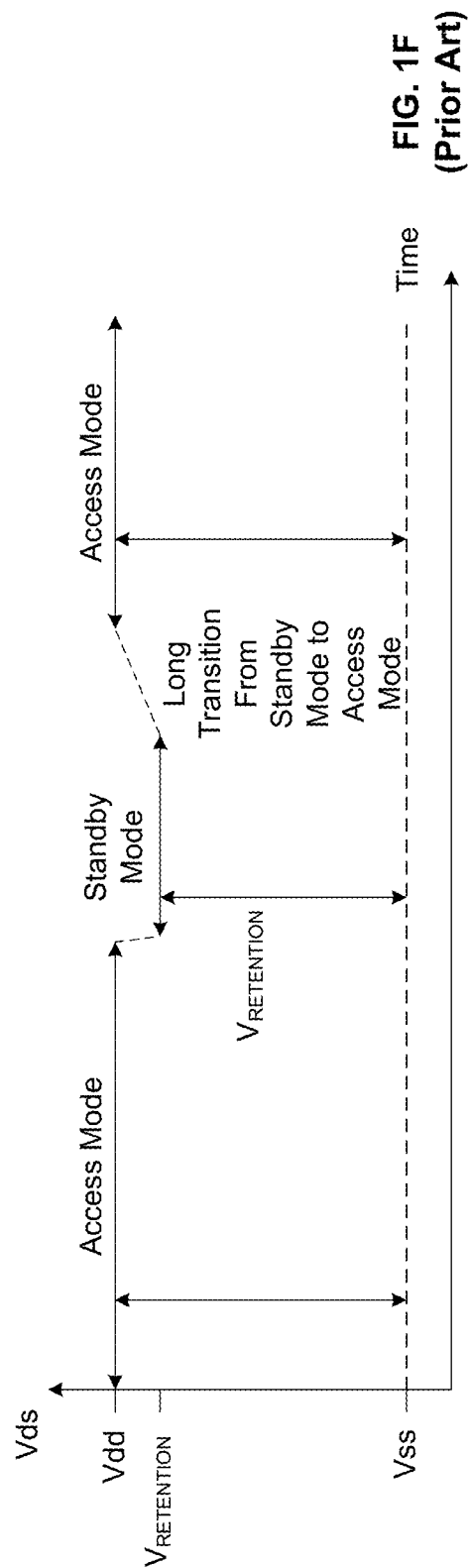
FIG. 1F illustrates a conventional method of static power reduction in a SRAM.

Comparing the disclosed method of FIG. 8A-8D to the convention method described in FIG. 1F, the switching in and out of the standby mode can be done quickly with the controller 804 and bias circuit 806. Thus, the performance of the system is improved. Moreover, the conventional method described in FIG. 1F is done when the entire SRAM is not in operation, for example during a period when a user device is in sleep mode. On the other hand, the disclosed method of FIG. 8A-8D can be performed when certain particular section of the SRAM memory is not being accessed, or when a particular row of bit cells are not being accessed. As a result, the static power consumption of the SRAM memory is reduced. Furthermore, by biasing a bit cell with $V_{BIAS}$ when it is not being accessed, it results in: 1) the drain to source voltage of one or more transistors of the bit cell has been reduced; 2) the body effect of the one or more transistors of the bit cell has been increased; and most importantly 3) the gate to source voltage of the one or more transistors of the bit cell has been reduced and may become negative. All the above effects can contribute to the reduction of static power consumption in a SRAM.

Figure 9A:
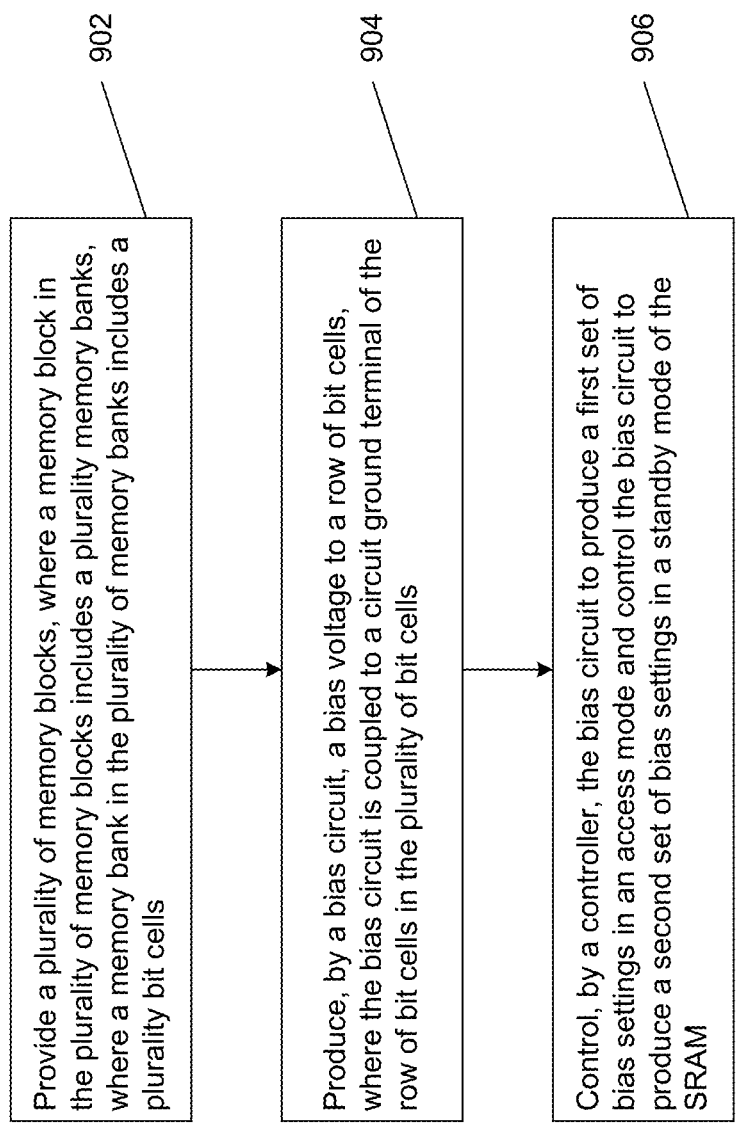
FIG. 9A illustrates an exemplary method of reducing static power in a SRAM according to aspects of the present disclosure.

FIG. 9A illustrates an exemplary method of reducing static power in a SRAM according to aspects of the present disclosure. In the exemplary implementation of FIG. 9A, in block 902, the method provides a plurality of memory blocks, where a memory block in the plurality of memory blocks includes a plurality memory banks, where a memory bank in the plurality of memory banks includes a plurality bit cells. In block 904, the method produces, by a bias circuit, a bias voltage to a row of bit cells, where the bias circuit is coupled to a circuit ground terminal of the row of bit cells in the plurality of bit cells. In block 906, the method controls, by a controller, the bias circuit to produce a first set of bias settings in an access mode and control the bias circuit to produce a second set of bias settings in a standby mode of the SRAM.

In some implementations, the method of producing the bias voltage by the bias circuit includes pulling down, by a first transistor, the bias voltage to circuit ground during an access mode of the row of bit cells, and pulling up, by a second transistor, the bias voltage to a first reference voltage during a standby mode of the row of bit cells. The first reference voltage can be programmable.

Figure 9B:
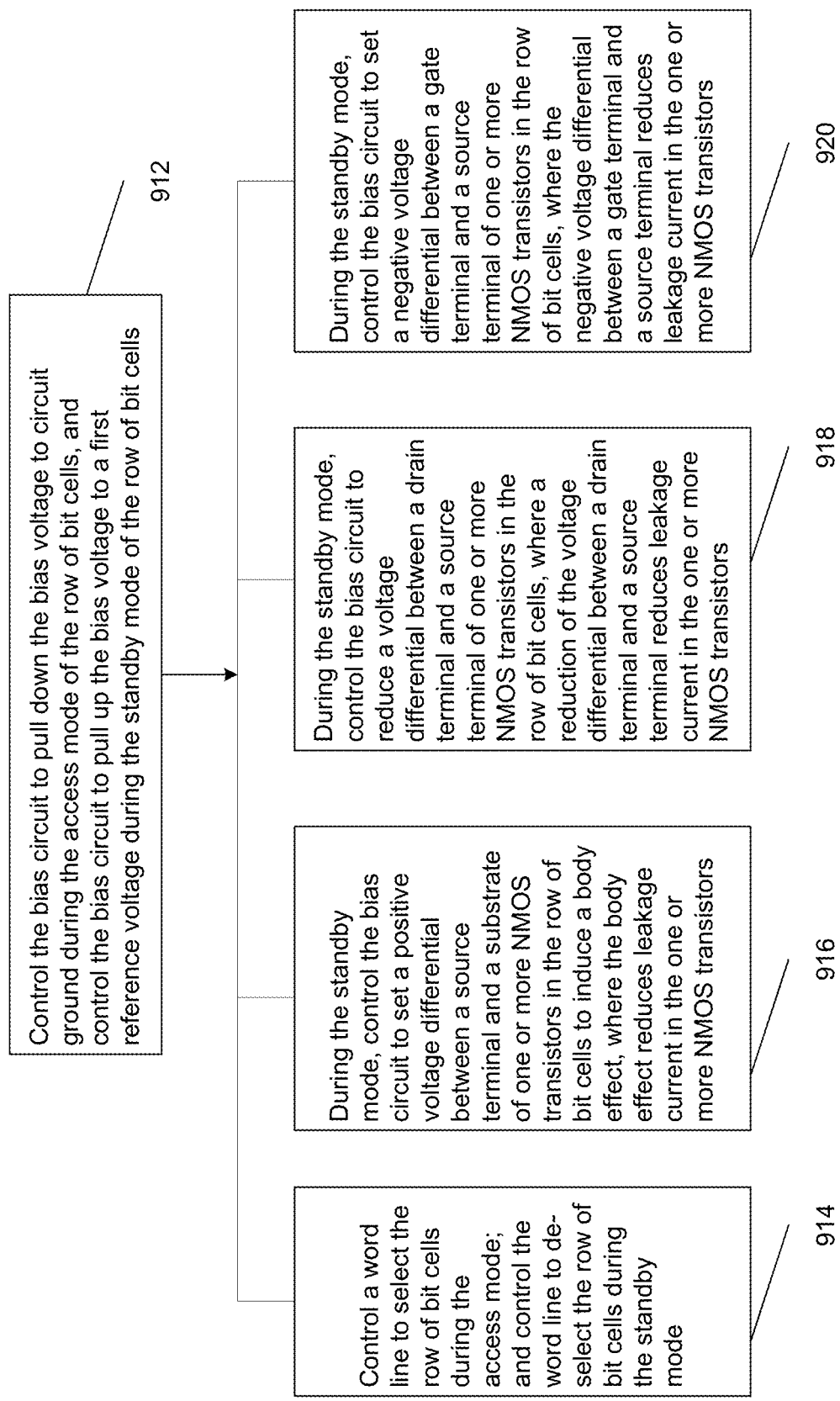
FIG. 9B illustrates an exemplary method of controlling a bias circuit according to aspects of the present disclosure.

FIG. 9B illustrates an exemplary method of controlling a bias circuit according to aspects of the present disclosure. As shown in the example of FIG. 9B, in block 912, the method controls the bias circuit to pull down the bias voltage to circuit ground during the access mode of the row of bit cells, and controls the bias circuit to pull up the bias voltage to a first reference voltage during the standby mode of the row of bit cells. In some implementations, the methods performed in block 912 may further include the methods performed in blocks 914, 916, 918, and 920.

In block 914, the method controls a word line to select the row of bit cells during the access mode, and controls the word line to de-select the row of bit cells during the standby mode. In block 916, during the standby mode, the method controls the bias circuit to set a positive voltage differential between a source terminal and a substrate of one or more NMOS transistors in the row of bit cells to induce a body effect, where the body effect reduces leakage current in the one or more NMOS transistors. In block 918, during the standby mode, the method controls the bias circuit to reduce a voltage differential between a drain terminal and a source terminal of one or more NMOS transistors in the row of bit cells, where a reduction of the voltage differential between a drain terminal and a source terminal reduces leakage current in the one or more NMOS transistors. In block 920, during the standby mode, the method controls the bias circuit to set a negative voltage differential between a gate terminal and a source terminal of one or more NMOS transistors in the row of bit cells, where the negative voltage differential between a gate terminal and a source terminal reduces leakage current in the one or more NMOS transistors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A circuit for signal communication, comprising:
a signal line configured to transmit signals;
a transmitter circuit configured to drive a transmitted signal onto the signal line;
a receiver circuit configured to detect the transmitted signal based on a deviation of a received signal from a reference signal on the signal line, wherein the deviation of the received signal from the reference signal on the signal line is a controlled voltage transition having a magnitude proportional to a ratio of capacitance between a capacitor of the transmitter circuit and capacitors of the signal line; and
the receiver circuit is further configured to use the received signal to communicate the transmitted signal.

2. The circuit of claim 1, wherein
the transmitter circuit is configured to cause a deviation in voltage at a receiver node of the signal line; and
the receiver circuit is configured to detect the deviation in voltage from a reference voltage at the receiver node of the signal line.

3. The circuit of claim 2, wherein the transmitter circuit comprises:
the capacitor configured to share charges with the signal line;
a pull down transistor configured to discharge the capacitor via control of a first switch and a second switch, or a pull up transistor configured to charge the capacitor via control of the first switch and the second switch;
wherein the pull down transistor or the pull up transistor is controlled to drive the signal line.

4. The circuit of claim 3, wherein the transmitter is further configured to:
for a low to high signal transition on the signal line, pre-charge the capacitor; and
drive the signal line using the pre-charged capacitor.

5. The circuit of claim 3, wherein the transmitter is further configured to:
for a high to low signal transition on the signal line, discharge the capacitor; and
drive the signal line using the discharged capacitor.

6. The circuit of claim 3, further comprises:
a pulse generator coupled to the pull down transistor and the pull up transistor, wherein the pulse generator is configured to generate a pulse onto the signal line based on the transmitted signal; and wherein a duration of the pulse is programmable.

7. The circuit of claim 2, wherein the receiver circuit comprises:
a sense amplifier configured to detect the deviation of the received signal from the reference signal on the receiver node of the signal line.

8. The circuit of claim 7, further comprises:
a holding circuit configured to maintain an input voltage at the receiver node of the signal line.

9. The circuit of claim 1, wherein
the transmitter circuit is configured to cause a deviation in current at a receiver node of the signal line; and
the receiver circuit is configured to reproduce the transmitted signal using the deviation in current at the receiver node of the signal line.

10. The circuit of claim 9, wherein the receiver circuit comprises:
a current mirror configured to multiply the deviation in current detected at the receiver node of the signal line; and
a capacitor configured to store charges produced by the current mirror, wherein the charges represent a signal strength of the transmitted signal.

11. The circuit of claim 1, wherein the signal line is configured to transmit bi-directional signals for different periods of signal transmission.

12. The circuit of claim 1, wherein an amount of deviation of the signal from the reference signal to be detected by the receiver is programmable.

13. A method of signal communication, comprising:
driving, by a transmitter circuit, a transmitted signal onto a signal line;
detecting, by a receiver circuit, the transmitted signal based on a deviation of a received signal from a reference signal on the signal line, wherein the deviation of the received signal from the reference signal on the signal line is a controlled voltage transition having a magnitude proportional to a ratio of capacitance between a capacitor of the transmitter circuit and capacitors of the signal line; and using, by the receiver circuit, the received signal to communicate the transmitted signal.

14. The method of claim 13, wherein causing, by the transmitter circuit, a deviation in voltage at a receiver node of the signal line; and detecting, by the receiver circuit, the deviation in voltage from a reference voltage at the receiver node of the signal line.

15. The method of claim 14, wherein the transmitter circuit comprises:

the capacitor configured to share charges with the signal line;

a pull down transistor configured to discharge the capacitor via control of a first switch and a second switch, or a pull up transistor configured to charge the capacitor via control of the first switch and the second switch;

wherein the pull down transistor or the pull up transistor is controlled to drive the signal line.

16. The method of claim 15, further comprising:

for a low to high signal transition on the signal line, pre-charging the capacitor; and driving the signal line using the pre-charged capacitor.

17. The method of claim 15, further comprising:

for a high to low signal transition on the signal line, discharging the capacitor; and driving the signal line using the discharged capacitor.

18. The method of claim 15, further comprises:

generating, by a pulse generator, a pulse onto the signal line based on the transmitted signal; wherein the pulse generator is coupled to the pull down transistor and the pull up transistor, and wherein a duration of the pulse is programmable.

19. The method of claim 14, wherein detecting the transmitted signal comprises:

detecting, by a sense amplifier, the deviation of the received signal from the reference signal on the receiver node of the signal line.

20. The method of claim 19, wherein detecting the transmitted signal further comprises:

maintaining, by a holding circuit, an input voltage at the receiver node of the signal line.

21. The method of claim 13, further comprising:

causing, by the transmitter circuit, a deviation in current at a receiver node of the signal line; and reproducing, by the receiver circuit, the transmitted signal using the deviation in current at the receiver node of the signal line.

22. The method of claim 21, wherein reproducing the transmitted signal comprises:

multiplying, by a current mirror, the deviation in current detected at the receiver node of the signal line; and storing, by a capacitor, charges produced by the current mirror, wherein the charges represent a signal strength of the transmitted signal.

23. The circuit of method 13, wherein the signal line is configured to transmit bi-directional signals for different periods of signal transmission.

24. The method of claim 13, wherein an amount of deviation of the signal from the reference signal to be detected by the receiver is programmable.

* * * * *